United States Patent
Kasai

(10) Patent No.: US 10,473,869 B2
(45) Date of Patent: Nov. 12, 2019

(54) LIGHT GUIDE DEVICE, LIGHT GUIDE METHOD, AND LD MODULE

(71) Applicant: FUJIKURA LTD., Tokyo (JP)

(72) Inventor: Yohei Kasai, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 16/079,684

(22) PCT Filed: Dec. 1, 2016

(86) PCT No.: PCT/JP2016/085711
§ 371 (c)(1),
(2) Date: Aug. 24, 2018

(87) PCT Pub. No.: WO2017/149873
PCT Pub. Date: Sep. 8, 2017

(65) Prior Publication Data
US 2019/0049676 A1 Feb. 14, 2019

(30) Foreign Application Priority Data

Mar. 3, 2016 (JP) .................................. 2016-041481

(51) Int. Cl.
*G02B 6/42* (2006.01)
*G02B 6/27* (2006.01)
(Continued)

(52) U.S. Cl.
CPC ............. *G02B 6/4213* (2013.01); *G02B 6/27* (2013.01); *G02B 6/42* (2013.01); *G02B 6/4206* (2013.01);
(Continued)

(58) Field of Classification Search
None
See application file for complete search history.

(56) References Cited

U.S. PATENT DOCUMENTS

2003/0223686 A1 12/2003 Ota et al.
2005/0069255 A1 3/2005 Nishimura et al.
(Continued)

FOREIGN PATENT DOCUMENTS

EP 2667238 A2 11/2013
JP 9-162501 A 6/1997
(Continued)

OTHER PUBLICATIONS

Extended (supplementary) European Search Report dated Feb. 14, 2019, issued in counterpart EP Application No. 16892708.5. (8 pages).
(Continued)

*Primary Examiner* — Tina M Wong
(74) *Attorney, Agent, or Firm* — Westerman, Hattori, Daniels & Adrian, LLP

(57) ABSTRACT

To increase the reliability of an LD module without decreasing the efficiency of coupling between the laser diode and the optical fiber, an LD module (1) includes a light-guiding device mounted therein that includes (i) a dividing optical system (DM) configured to divide a laser beam so as to generate a partial beam group and (ii) a compositing optical system (RM1, RM2, PRE, PBC) configured to composite the partial beam group so as to generate a partial beam bundle including a plurality of partial beams each having an S axis parallel to a particular spatial axis.

8 Claims, 6 Drawing Sheets

(51) Int. Cl.
  *G02B 27/09* (2006.01)
  *G02B 27/28* (2006.01)
  *H01S 5/00* (2006.01)
  *H01S 5/022* (2006.01)
  *G02B 27/10* (2006.01)
  *G02B 27/14* (2006.01)
  *H01S 5/40* (2006.01)

(52) U.S. Cl.
  CPC ....... *G02B 27/0905* (2013.01); *G02B 27/106* (2013.01); *G02B 27/143* (2013.01); *G02B 27/283* (2013.01); *H01S 5/005* (2013.01); *H01S 5/02284* (2013.01); *H01S 5/0071* (2013.01); *H01S 5/4012* (2013.01)

(56) References Cited

U.S. PATENT DOCUMENTS

| | | |
|---|---|---|
| 2011/0211608 A1 | 9/2011 | Fujimoto et al. |
| 2012/0147471 A1 | 6/2012 | Liu et al. |
| 2013/0215923 A1 | 8/2013 | Cobb |
| 2019/0049676 A1* | 2/2019 | Kasai .................. G02B 6/4213 |

FOREIGN PATENT DOCUMENTS

| | | |
|---|---|---|
| JP | 2003-329900 A | 11/2003 |
| JP | 2003-344803 A | 12/2003 |
| JP | 2005-84252 A | 3/2005 |
| JP | 2005-107319 A | 4/2005 |
| JP | 2007-286481 A | 11/2007 |
| WO | 2010/050071 A1 | 5/2010 |

OTHER PUBLICATIONS

Decision to Grant dated Apr. 17, 2018, issued in counterpart of Japanese Patent Application No. 2016-041481 (2 pages).
Office Action dated Sep. 12, 2017, issued in counterpart of Japanese Patent Application No. 2016-041481 (2 pages).
Office Action dated Feb. 28, 2017, issued in counterpart of Japanese Patent Application No. 2016-041481 (2 pages).
International Search Report dated Feb. 28, 2017, issued in counterpart International Application No. PCT/JP2016/085711 (2 pages).

* cited by examiner

LIGHT GUIDE DEVICE, LIGHT GUIDE METHOD, AND LD MODULE

TECHNICAL FIELD

The present invention relates to a light-guiding device and a light-guiding method both for guiding a laser beam, and to an LD module including the light-guiding device.

BACKGROUND ART

LD modules are in wide use that include a laser diode and an optical fiber and that are configured to cause a laser beam outputted from the laser diode to enter the optical fiber. To increase the reliability of such LD modules, it is necessary to increase the mean time to failure of the laser diode.

Examples of known techniques for increasing the mean time to failure of laser diodes include the respective techniques disclosed in Patent Literatures 1 and 2. The technique disclosed in Patent Literature 1 is intended to prevent or reduce catastrophic optical damage (COD) by treating an end surface of a laser diode with a treatment liquid that serves to prevent or reduce the surface level. The technique disclosed in Patent Literature 2 is intended to decrease the light confinement coefficient (r factor) of an active layer by dispersing the vertical light density.

CITATION LIST

Patent Literature

[Patent Literature 1]
Japanese Patent Application Publication, Tokukaihei, No. 9-162501 (Publication Date: Jun. 20, 1997)
[Patent Literature 2]
International Publication No. 2010/050071 (Publication Date: May 6, 2010)

SUMMARY OF INVENTION

Technical Problem

The mean time to failure of a laser diode is related to the emitter width of the laser diode. Specifically, the following relation holds true:

$$MTTF_L = MTTF_s \left(\frac{P_s}{P_L}\right)^n \exp\left(\frac{E_a}{k}\left(\frac{1}{T_L} - \frac{1}{T_s}\right)\right) \quad [\text{Math. 1}]$$

where $MTTF_S$ is the mean time to failure of a first laser diode having a relatively small emitter width, and $MTTF_L$ is the mean time to failure of a second laser diode having a relatively large emitter width.

In the above equation, P is a light output, n is a power acceleration factor, T is a junction temperature, Ea is an activation energy, and k is a Boltzmann constant. The suffix "s" indicates that the amount is about the first laser diode, whereas the suffix "L" indicates that the amount is about the second laser diode.

Increasing the emitter width decreases the light density and lowers the junction temperature $T_L$ (as the increase in the emitter width decreases the electric resistance and the thermal resistance, and consequently reduces heat generation), with the result of an increased mean time to failure $MTTF_L$. This means that to increase the reliability of an LD module, the emitter width of the laser diode may simply be increased.

Increasing the emitter width of a laser diode, however, increases the output beam parameter product of the laser diode (that is, the product of the emitter width and the beam divergence angle of the laser diode). In a case where the output BPP of the laser diode exceeds the input beam parameter product of the optical fiber (that is, the product of the core diameter and the maximum light-reception angle of the optical fiber), not all of a laser beam outputted from the laser diode is received by the core, with the result of a decreased efficiency of coupling between the laser diode and the optical fiber. Further, that portion of the laser beam which is not received by the optical fiber may, for example, degrade or burn the cladding of the optical fiber to end up being another cause of a decrease in the reliability of the LD module.

A laser diode that is free from a decrease in the efficiency of coupling with an optical fiber has an emitter width with an upper limit (hereinafter referred to as emitter width upper limit). In a case where, for instance, a laser diode has a beam divergence angle equivalent to the maximum light-reception angle of an optical fiber, the emitter width upper limit is equal to the core diameter of the optical fiber. The reliability of a conventional LD module may be increased through an increase in the emitter width, but this increase in the reliability has unfortunately been limited by the emitter width upper limit.

The present invention has been accomplished in view of the above issue. It is an object of the present invention to provide an LD module that (i) allows a laser diode to have an emitter width larger than the emitter width upper limit without decreasing the efficiency of coupling between the laser diode and an optical fiber and that (ii) is thus more reliable than conventional LD modules.

Solution to Problem

In order to attain the above object, a light-guiding device of an embodiment of the present invention includes: a dividing optical system configured to divide a laser beam so as to generate a partial beam group consisting of a plurality of partial beams having respective traveling directions different from each other; and a compositing optical system configured to composite the partial beam group so as to generate a partial beam bundle consisting of a plurality of partial beams each having an S axis parallel to a particular spatial axis, the partial beam bundle having an S-axis diameter smaller than an S-axis diameter of the laser beam.

In order to attain the above object, a light-guiding method of an embodiment of the present invention includes the steps of: dividing a laser beam so as to generate a partial beam group including a plurality of partial beams having respective traveling directions different from each other; and compositing the partial beam group so as to generate a partial beam bundle including a plurality of partial beams each having an S axis parallel to a particular spatial axis, the partial beam bundle having an S-axis diameter smaller than an S-axis diameter of the laser beam.

Advantageous Effects of Invention

The present invention provides an LD module that allows a laser diode to have an emitter width larger than the emitter

Figure 5:
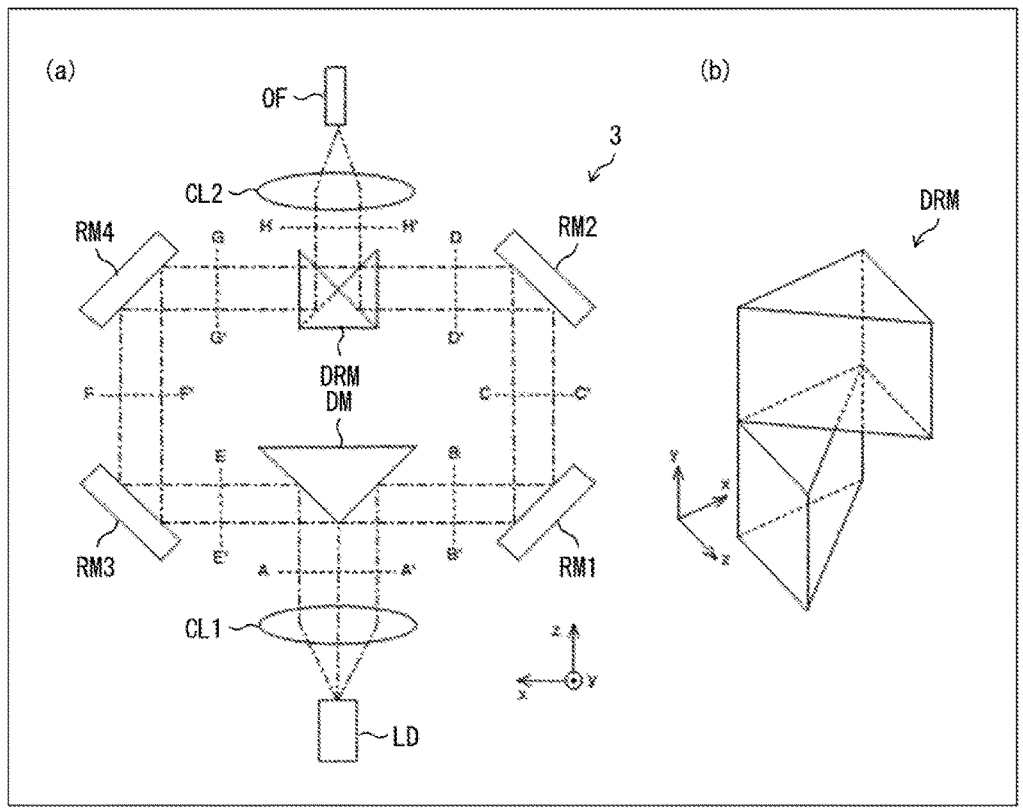

(a) of FIG. 5 is a plan view of an LD module in accordance with a third embodiment of the present invention, the view illustrating the configuration of the LD module, and (b) of FIG. 5 is a perspective view of a double reflective mirror included in the LD module, the view illustrating an example configuration of the double reflective mirror.

Figure 6:
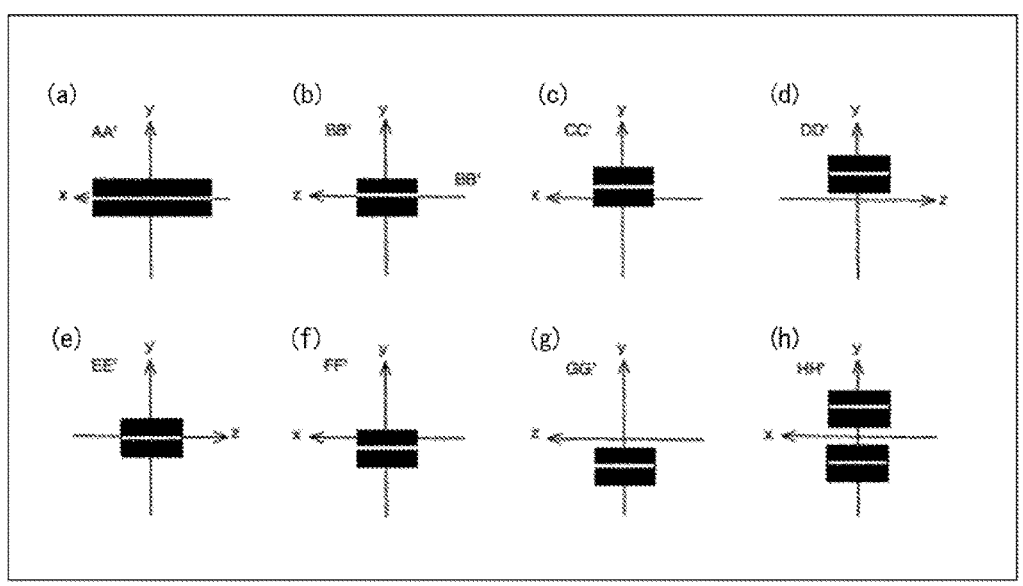

FIG. 6 shows cross-sectional views of a laser beam, a partial beam, and a partial beam bundle at different portions of the LD module illustrated in FIG. 5, the views each illustrating a beam cross section.

Figure 7:
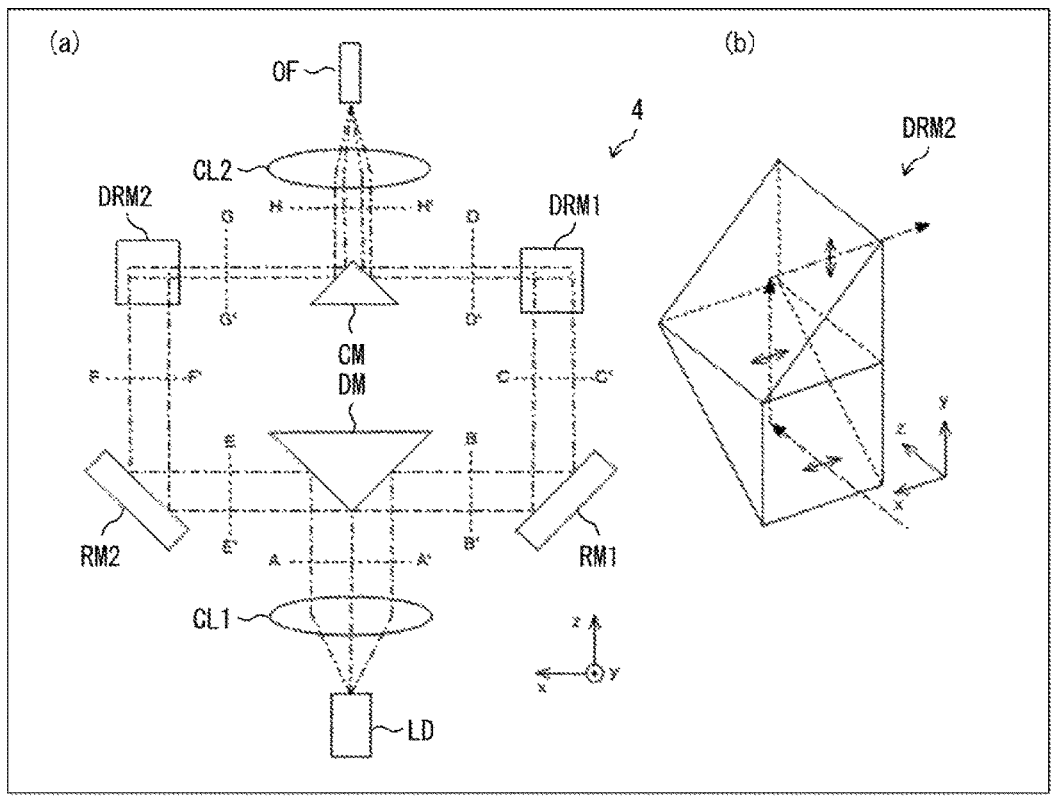

(a) of FIG. 7 is a plan view of an LD module in accordance with a fourth embodiment of the present invention, the view illustrating the configuration of the LD module, and (b) of FIG. 7 is a perspective view of a double reflective mirror included in the LD module, the view illustrating an example configuration of the double reflective mirror.

Figure 8:
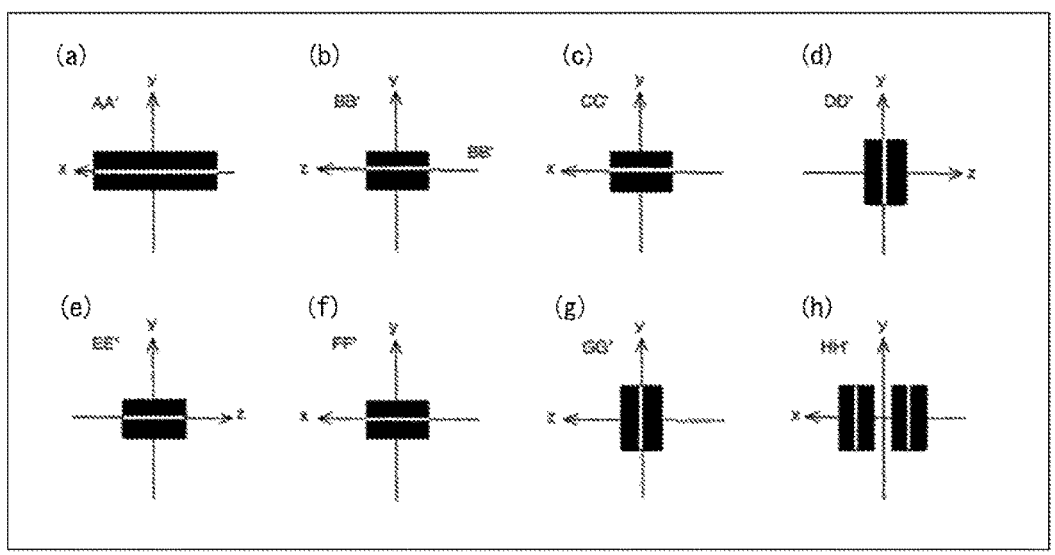

FIG. 8 shows cross-sectional views of a laser beam, a partial beam, and a partial beam bundle at different portions of the LD module illustrated in FIG. 7, the views each illustrating a beam cross section.

Figure 9:
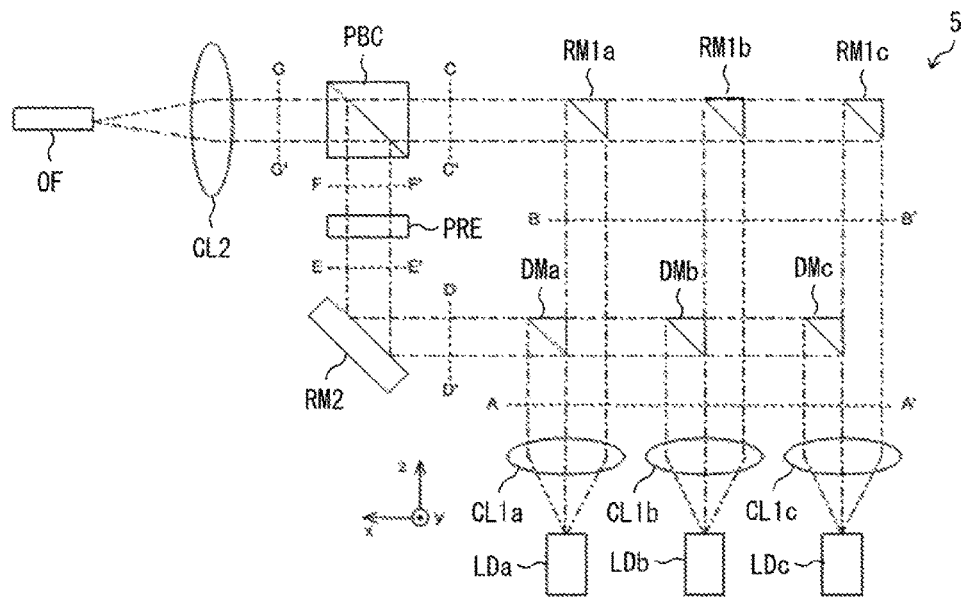

FIG. 9 is a plan view of an LD module in accordance with a fifth embodiment of the present invention, the view illustrating the configuration of the LD module.

Figure 10:
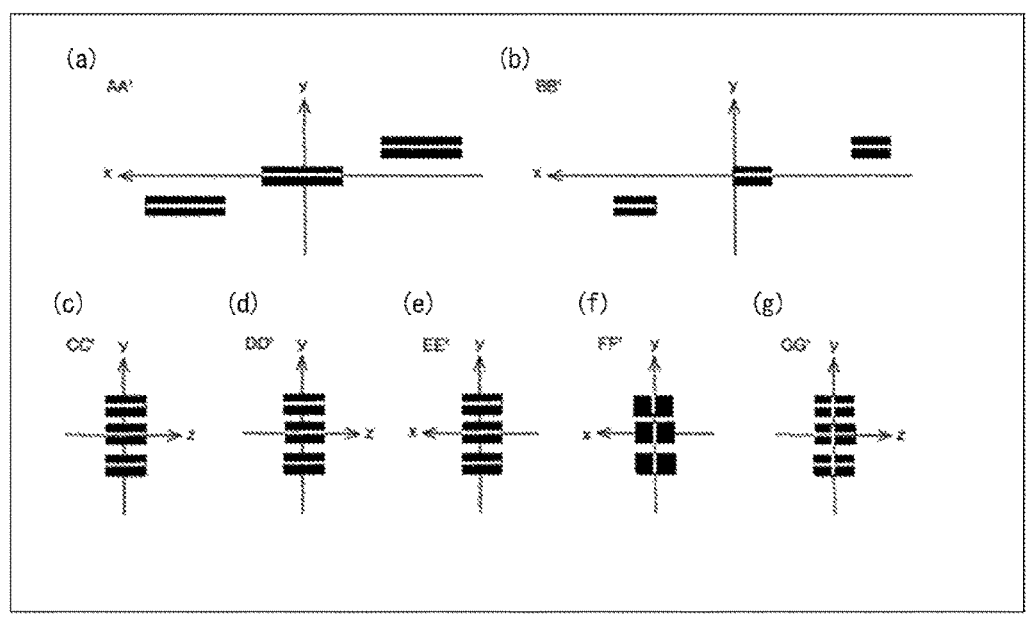

FIG. 10 shows cross-sectional views of a laser beam, a partial beam, and a partial beam bundle at different portions of the LD module illustrated in FIG. 9, the views each illustrating a beam cross section.

Figure 11:
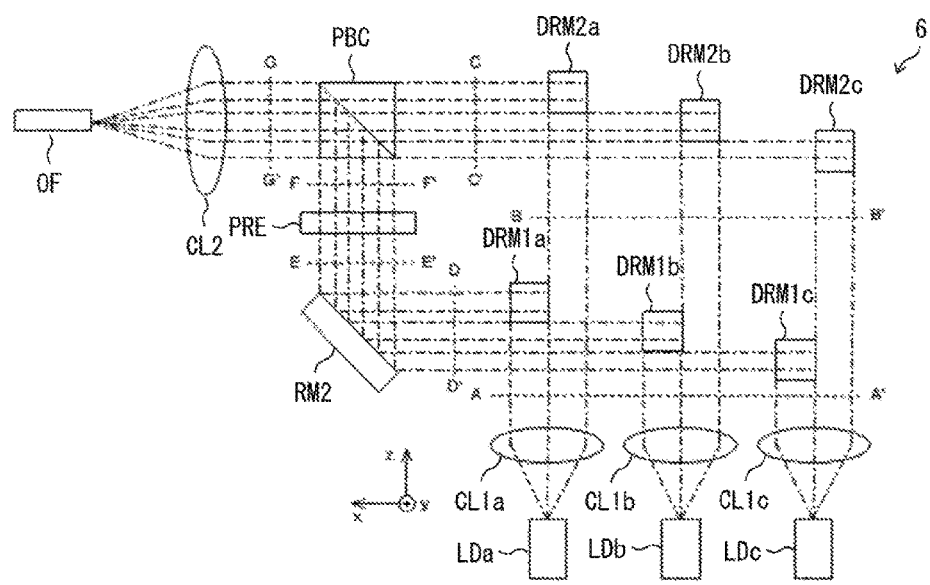

FIG. 11 is a plan view of an LD module in accordance with a sixth embodiment of the present invention, the view illustrating the configuration of the LD module.

Figure 12:
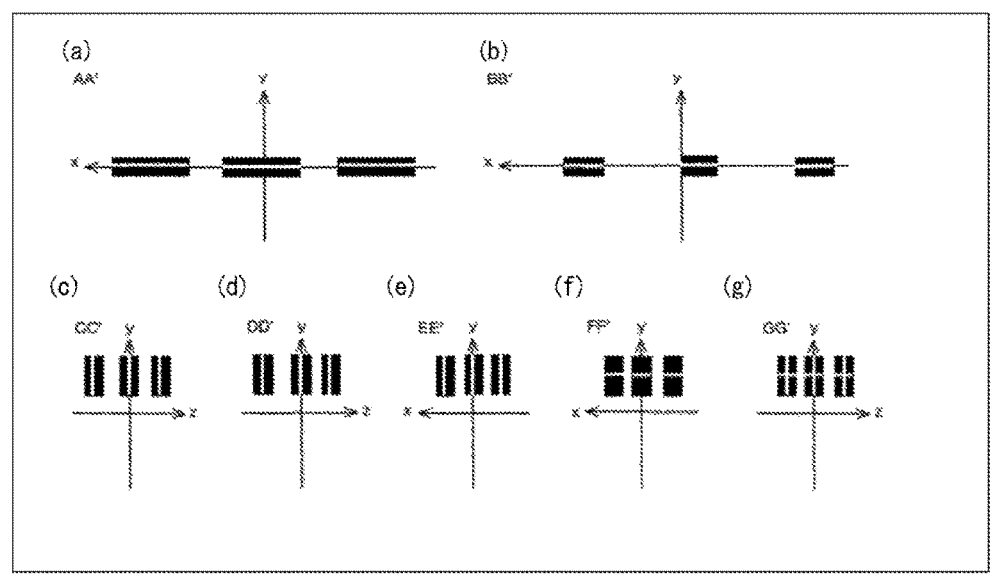

FIG. 12 shows cross-sectional views of a laser beam, a partial beam, and a partial beam bundle at different portions of the LD module illustrated in FIG. 11, the views each illustrating a beam cross section.

DESCRIPTION OF EMBODIMENTS

Definitions of Terms

In the present specification: A "beam cross section" of a beam refers to a region on a plane orthogonal to the traveling direction of the beam which region is defined by an iso-power curve of the beam and which region covers 95% of the total power of the beam. An "S-axis diameter" of a beam refers to the length of a side, parallel to the S axis of the beam, of a rectangle on a plane orthogonal to the traveling direction of the beam which rectangle has a side parallel to the S axis of the beam and which rectangle circumscribes a beam cross section of the beam. An "F-axis diameter" of a beam refers to the length of a side of the above rectangle which side is parallel to the F axis of the beam. In a case where, for instance, a beam has a beam cross section in the shape of an ellipse having a long axis along the S axis of the beam, the length of the long axis of the ellipse corresponds to the S-axis diameter, whereas the length of the short axis of the ellipse corresponds to the F-axis diameter. A "beam bundle" refers to a set of a plurality of beams each having an S axis parallel to a particular spatial axis. The individual beams constituting a beam bundle may (i) all travel in a single, particular direction orthogonal to the particular spatial axis or (ii) travel in different directions distributed around a particular direction on a plane orthogonal to the particular spatial axis. In either case, the above particular direction may be regarded as the traveling direction of the beam bundle. An "S-axis diameter" of a beam bundle refers to the length of a side, parallel to the above particular spatial axis, of a rectangle on a plane orthogonal to the traveling direction of the beam bundle which rectangle has a side parallel to the above particular spatial axis and which rectangle circumscribes the union of the respective beam cross sections of the individual beams constituting the beam bundle.

[First Embodiment]

Figure 1:
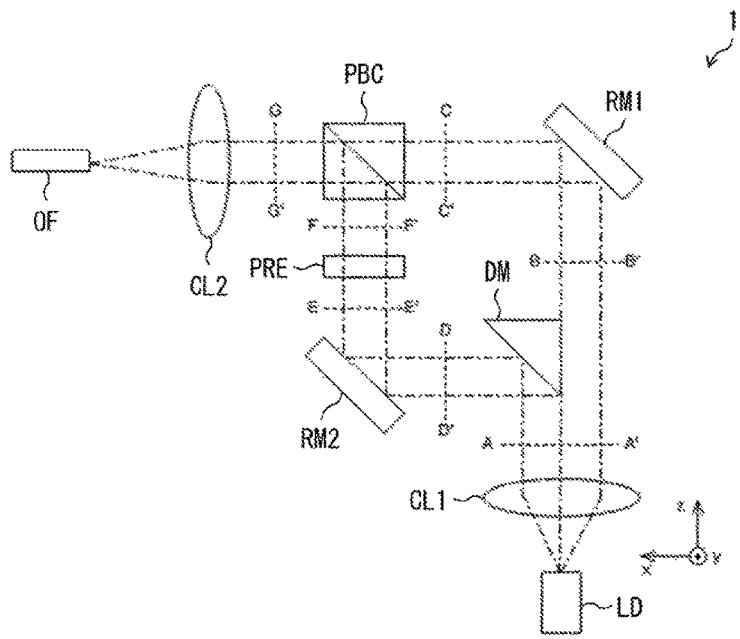
FIG. 1 is a plan view of an LD module in accordance with a first embodiment of the present invention, the view illustrating the configuration of the LD module.
Figure 2:
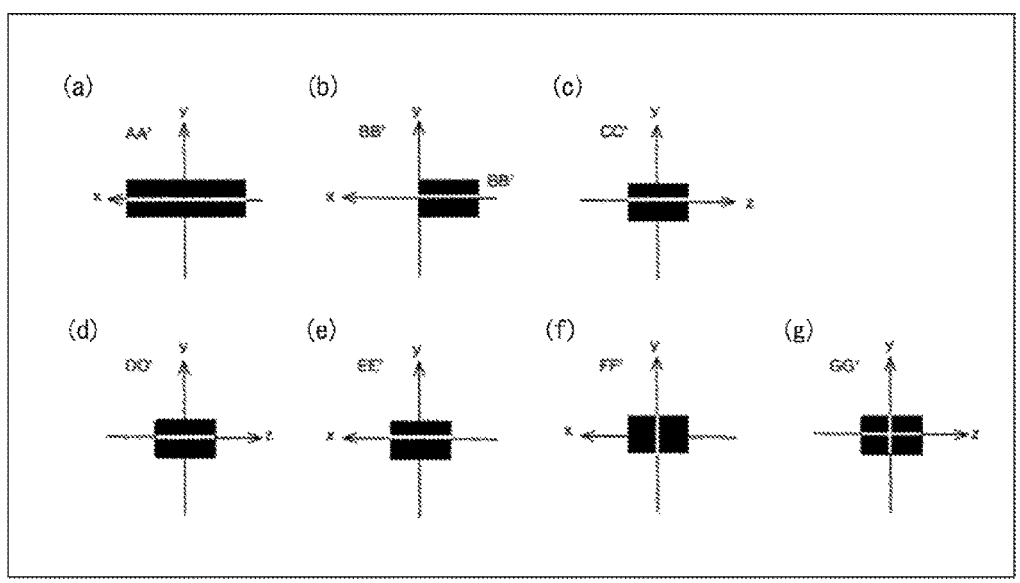
FIG. 2 shows cross-sectional views of a laser beam, a partial beam, and a partial beam bundle at different portions of the LD module illustrated in FIG. 1, the views each illustrating a beam cross section.

The description below deals with an LD module 1 in accordance with a first embodiment of the present invention with reference to FIGS. 1 and 2. FIG. 1 is a plan view of the LD module 1, the view illustrating the configuration of the LD module 1. FIG. 2 shows cross-sectional views of a laser beam, a partial beam, and a partial beam bundle at different portions of the LD module 1, the views each illustrating a beam cross section.

The LD module 1, as illustrated in FIG. 1, includes a laser diode LD, a collimating lens CL1, a dividing optical system 11 (including a dividing mirror DM), a compositing optical system 12 (including a first reflective mirror RM1, a second reflective mirror RM2, a polarization rotating element PRE, and a polarization beam combiner PBC), a convergent lens CL2, and an optical fiber OF. The LD module 1 is configured such that the collimating lens CL1, the dividing optical system 11, the compositing optical system 12, and the convergent lens CL2 constitute a light-guiding device configured to guide laser light from the laser diode LD to the optical fiber OF.

The laser diode LD outputs a laser beam. The laser diode LD is oriented so as to have, in the coordinate system illustrated, (i) an active layer parallel to the zx plane and (ii) an emission end surface facing the z-axis positive direction. The laser diode LD thus outputs a laser beam having (i) an S axis (slow axis) parallel to the x axis, (ii) an F axis (fast axis) parallel to the y axis, and (iii) a polarization direction parallel to the x axis. The laser beam outputted from the laser diode LD travels in the z-axis positive direction.

The laser beam generated by the laser diode LD has an optical path on which the collimating lens CL1 is positioned. The collimating lens CL1 collimates the laser beam outputted from the laser diode LD. In other words, before passing through the collimating lens CL1, the laser beam is diffused light having an S-axis diameter and an F-axis diameter both of which become gradually larger, but after passing through the collimating lens CL1, the laser beam is parallel light having a constant S-axis diameter and a constant F-axis diameter.

(a) of FIG. 2 shows a beam cross section (AA' cross section) of a laser beam collimated through the collimating lens CL1. As illustrated in (a) of FIG. 2, the laser beam collimated through the collimating lens CL1 has an S axis parallel to the x axis, an F axis parallel to the y axis, and a polarization direction parallel to the x axis. Note that the beam cross sections (each illustrated as a solid rectangle) illustrated in FIG. 2 merely approximate, and thus do not accurately represent, the respective shapes of the actual beam cross sections. The beam cross sections illustrated in FIG. 2 each have a white line indicative of the polarization direction of the corresponding beam. This applies also to FIGS. 4, 6, 8, 10, and 12.

The laser beam collimated through the collimating lens CL1 has an optical path on which the dividing mirror DM is positioned. The dividing mirror DM divides the laser beam collimated through the collimating lens CL1 and thereby generates a partial beam group consisting of a first partial beam and a second partial beam having respective traveling directions different from each other. The dividing mirror DM for use in the present embodiment is oriented so as to (i) have a reflective surface that reflects half of the laser beam collimated through the collimating lens CL1 which half is present on the side of the x-axis positive direction so that the reflected half will be directed in the x-axis positive direction and (ii) not receive the other half (present on the side of the x-axis negative direction) of the laser beam collimated through the collimating lens CL1. The half of the laser beam collimated through the collimating lens CL1 which half is present on the side of the x-axis negative direction is thus not reflected on the reflective surface of the dividing mirror DM and travels in the z-axis positive direction as the first partial beam. The first partial beam has (i) an S-axis diameter approximately half the S-axis diameter of the laser beam collimated through the collimating lens CL1 and (ii) an F-axis diameter equal to the F-axis diameter of the laser beam collimated through the collimating lens CL1. The half of the laser beam collimated through the collimating lens CL1 which half is present on the side of the x-axis positive direction is reflected on the reflective surface of the dividing mirror DM and travels in the x-axis positive direction as the second partial beam. The second partial beam has (i) an S-axis diameter approximately half the S-axis diameter of the laser beam collimated through the collimating lens CL1 and (ii) an F-axis diameter equal to the F-axis diameter of the laser beam collimated through the collimating lens CL1.

(b) of FIG. 2 shows a beam cross section (BB' cross section) of the first partial beam generated through the dividing mirror DM. (d) of FIG. 2 shows a beam cross section (DD' cross section) of the second partial beam generated through the dividing mirror DM. As illustrated in (b) of FIG. 2, the beam cross section of the first partial beam generated through the dividing mirror DM has an S axis parallel to the x axis and an F axis parallel to the y axis. As illustrated in (d) of FIG. 2, the beam cross section of the second partial beam generated through the dividing mirror DM has an S axis parallel to the z axis and an F axis parallel to the y axis. The first partial beam and the second partial beam both generated through the dividing mirror DM each have an S-axis diameter approximately half the S-axis diameter of the laser beam collimated through the collimating lens CL1. The first partial beam and the second partial beam both generated through the dividing mirror DM each have an F-axis diameter equal to the F-axis diameter of the laser beam collimated through the collimating lens CL1.

The first partial beam generated through the dividing mirror DM has an optical path on which the first reflective mirror RM1 is positioned. The first reflective mirror RM1 reflects the first partial beam generated through the dividing mirror DM so as to change the traveling direction of the first partial beam from the z-axis positive direction to the x-axis positive direction.

(c) of FIG. 2 shows a beam cross section (CC' cross section) of the first partial beam reflected by the first reflective mirror RM1. As illustrated in (c) of FIG. 2, the beam cross section of the first partial beam reflected by the first reflective mirror RM1 has an S axis parallel to the z axis, an F axis parallel to the y axis, and a polarization direction parallel to the z axis.

The second partial beam generated through the dividing mirror DM has an optical path on which the second reflective mirror RM2 is positioned. The second reflective mirror RM2 reflects the second partial beam generated through the dividing mirror DM so as to change the traveling direction of the second partial beam from the x-axis positive direction to the z-axis positive direction.

(e) of FIG. 2 shows a beam cross section (EE' cross section) of the second partial beam reflected by the second reflective mirror RM2. As illustrated in (e) of FIG. 2, the beam cross section of the second partial beam reflected by the second reflective mirror RM2 has an S axis parallel to the x axis, an F axis parallel to the y axis, and a polarization direction parallel to the x axis.

The second partial beam reflected by the second reflective mirror RM2 has an optical path on which the polarization rotating element PRE is positioned. The polarization rotating element PRE rotates by 90 degrees the polarization direction of the second partial beam reflected by the second reflective mirror RM2. Before passing through the polarization rotating element PRE, the second partial beam has a polarization direction parallel to the x axis, but after passing through the polarization rotating element PRE, the second partial beam has a polarization direction parallel to the y axis.

(f) of FIG. 2 shows a beam cross section (FF' cross section) of the second partial beam having a polarization direction rotated by the polarization rotating element PRE. As illustrated in (f) of FIG. 2, the beam cross section of the second partial beam having a polarization direction rotated by the polarization rotating element PRE has an S axis parallel to the x axis, an F axis parallel to the y axis, and a polarization direction parallel to the y axis. Note that the polarization direction of the second partial beam is rotated from a direction parallel to the x axis to a direction parallel to the y axis as the second partial beam passes through the polarization rotating element PRE.

The first partial beam reflected by the first reflective mirror RM1 has an optical path, whereas the second partial beam having passed through the polarization rotating element PRE has an optical path, the two optical paths crossing each other at a point at which the polarization beam combiner PBC is positioned. The polarization beam combiner PBC polarization-composites the first partial beam reflected by the first reflective mirror RM1 and the second partial beam having passed through the polarization rotating element PRE and thereby generates a partial beam bundle consisting of the first partial beam and the second partial beam, which share the same traveling direction and the same S-axis direction. The polarization beam combiner PBC for use in the present embodiment has a functional surface that allows passage therethrough of a first partial beam reflected by the first reflective mirror RM1 and having a polarization direction parallel to the zx plane (which first partial beam has an S axis parallel to the z axis and travels in the x-axis positive direction) and that reflects a second partial beam having passed through the polarization rotating element PRE and having a polarization direction perpendicular to the zx plane (which second partial beam has an S axis parallel to the y axis and travels in the z-axis positive direction) so that the reflected second partial beam will travel in the x-axis positive direction. The polarization beam combiner PBC thus generates a partial beam bundle consisting of a first partial beam and a second partial beam each having an S axis parallel to the z axis and traveling in the x-axis positive direction.

The first reflective mirror RM1 and the second reflective mirror RM2 for use in the present embodiment are oriented so that the first partial beam reflected by the first reflective mirror RM1 and the second partial beam reflected by the second reflective mirror RM2 are incident on the same region of the functional surface of the polarization beam combiner PBC. Thus, in the partial beam bundle generated by the polarization beam combiner PBC, the respective beam cross sections of the first partial beam and the second partial beam coincide entirely with each other. The partial beam bundle thus has an S-axis diameter that is equal to the respective S-axis diameters of the first partial beam and the second partial beam and that is approximately half the S-axis diameter of the laser beam. The partial beam bundle has an F-axis diameter that is equal to the respective F-axis diameters of the first partial beam and the second partial beam and that is also equal to the F-axis diameter of the laser beam.

(g) of FIG. 2 shows a beam cross section (GG' cross section) of a partial beam bundle generated by the polarization beam combiner PBC. As illustrated in (g) of FIG. 2, the respective beam cross sections of the individual partial beams constituting the partial beam bundle generated by the polarization beam combiner PBC each have an S axis parallel to the z axis and an F axis parallel to the y axis. As described above, the partial beam bundle generated by the polarization beam combiner PBC has an S-axis diameter approximately half the S-axis diameter of the laser beam collimated through the collimating lens CL1. The partial beam bundle generated by the polarization beam combiner PBC has an F-axis diameter equal to the F-axis diameter of the laser beam collimated through the collimating lens CL1.

The partial beam bundle generated by the polarization beam combiner PBC has an optical path on which the convergent lens CL2 is positioned. The convergent lens CL2 converges a partial beam bundle generated by the polarization beam combiner PBC. In other words, before passing through the convergent lens CL2, the partial beam bundle is parallel light having a constant S-axis diameter and a constant F-axis diameter, but after passing through the convergent lens CL2, the partial beam bundle is convergent light having an S-axis diameter and an F-axis diameter both of which become gradually smaller.

The partial beam bundle converged by the convergent lens CL2 has an optical path on which the entry end surface of the optical fiber OF is positioned. The entry end surface of the optical fiber OF is oriented so that the center of the core of the optical fiber coincides with the center of the beam cross section of the partial beam bundle at a point at which the S-axis diameter of the partial beam bundle is at its minimum. This allows the beam cross section of the partial beam bundle to be within the core of the optical fiber OF at the entry end surface of the optical fiber OF.

As described above, the LD module 1 includes a light-guiding device including (1) a dividing optical system (including a dividing mirror DM) configured to divide a laser beam collimated through the collimating lens CL1 and thereby generate a partial beam group consisting of a first partial beam traveling in the z-axis positive direction and a second partial beam traveling in the x-axis positive direction and (2) a compositing optical system (including a first reflective mirror RM1, a second reflective mirror RM2, a polarization rotating element PRE, and a polarization beam combiner PBC) configured to composite the partial beam group and thereby generate a partial beam bundle consisting of a first partial beam and a second partial beam both traveling in the x-axis positive direction.

The dividing optical system halves the beam cross section of the laser beam along a dividing line parallel to the F axis of the laser beam. As a result, the first partial beam and the second partial beam each have (i) an S-axis diameter half the S-axis diameter of the laser beam and (ii) an F-axis diameter equal to the F-axis diameter of the laser beam. The compositing optical system polarization-composites the partial beam group so that in each cross section (GG' cross section) of the partial beam bundle, (1) the first partial beam and the second partial beam constituting the partial beam bundle each have an S axis parallel to a first spatial axis (z axis), and (2) the respective beam cross sections of the first partial beam and the second partial beam constituting the partial beam bundle coincide entirely with each other. As a result, the partial beam bundle has (i) an S-axis diameter half the S-axis diameter of the laser beam and (ii) an F-axis diameter equal to the F-axis diameter of the laser beam.

Using a light-guiding device configured as above allows a laser beam outputted from the laser diode LD to be converted into a partial beam bundle having an S-axis diameter smaller than the S-axis diameter of the laser beam. This makes it possible to increase the emitter width of the laser diode LD without decreasing the efficiency of coupling between the laser diode LD and the optical fiber OF. This in turn makes it possible to increase the reliability of the LD module 1 without decreasing its coupling efficiency.

The light-guiding device included in the LD module 1 in accordance with the present embodiment, in particular, allows a laser beam outputted from the laser diode LD to be converted into a partial beam bundle having an S-axis diameter that is half the S-axis diameter of the laser beam. This makes it possible to increase the emitter width of the laser diode LD two-fold without decreasing the efficiency of coupling between the laser diode LD and the optical fiber OF. This in turn makes it possible to dramatically increase the reliability of the LD module 1 without decreasing its coupling efficiency.

The present embodiment polarization-composites a partial beam group. The present invention is, however, not limited to such a configuration. The present invention may, for instance, be configured to wavelength-composite a partial beam group. Polarization-compositing a partial beam group means causing the respective polarization directions of the individual partial beams constituting the partial beam group to differ from each other with use of a polarization rotating element and then compositing the individual partial beams in such a manner that the respective beam cross sections of the individual partial beams coincide with each other. Wavelength-compositing a partial beam group means causing the respective wavelengths of the individual partial beams constituting the partial beam group to differ from each other with use of a wavelength conversion element and then compositing the individual partial beams in such a manner that the respective beam cross sections of the individual partial beams coincide with each other.

The present embodiment is configured to halve a beam cross section of a laser beam along a dividing line parallel to the F axis of the laser beam so that a first partial beam and a second partial beam have an equal S-axis diameter. The present invention is, however, not limited to such a configuration. The present invention may be configured to divide a beam cross section of a laser beam along a dividing line parallel to the F axis into unequal parts so that a first partial beam and a second partial beam have respective S-axis diameters different from each other. In this case, the partial beam bundle will have an S-axis diameter equal to the larger of the respective S-axis diameters of the first partial beam and the second partial beam. The S-axis diameter of the partial beam bundle will thus be larger than half the S-axis diameter of the laser beam and smaller than the S-axis diameter of the laser beam.

The present embodiment is configured to composite a partial beam group in such a manner as to satisfy the following condition: The respective beam cross sections of the first partial beam and the second partial beam constituting the partial beam bundle coincide entirely with each other. The present invention is, however, not limited to such a configuration. The above condition can be divided into the following two conditions: (1) The projection on a first spatial axis (z axis) of the beam cross section of the first partial beam included in the partial beam bundle and the projection on the first spatial axis of the beam cross section of the second partial beam included in the partial beam bundle coincide entirely with each other (first condition). (2) The projection on a second spatial axis (y axis), orthogonal to the first spatial axis, of the beam cross section of the first partial beam included in the partial beam bundle and the projection on the second spatial axis of the beam cross section of the second partial beam included in the partial beam bundle coincide entirely with each other (second condition). In a case where the laser beam has a sufficiently oblate beam cross section, merely satisfying the first condition alone allows each partial beam to have an S-axis diameter that is half the S-axis diameter of the laser beam as in the present embodiment. The first condition may be replaced with the following condition: A portion of the projection on a first spatial axis of the beam cross section of the first partial beam included in the partial beam bundle and a portion of the projection on the first spatial axis of the beam cross section of the second partial beam included in the partial beam bundle coincide with each other. In this case, the S-axis diameter of the partial beam bundle will be larger than half the S-axis diameter of the laser beam and smaller than the S-axis diameter of the laser beam.

For the present embodiment, the number of partial beams constituting a partial beam group or a partial beam bundle is two. The present invention is, however, not limited to such a configuration. The number of partial beams constituting a partial beam group or a partial beam bundle can be generalized as any natural number n of two or more. In this case, the S-axis diameter of the partial beam bundle will be 1/n the S-axis diameter of the laser beam.

The present embodiment is configured such that the respective optical paths of two partial beams which optical paths extend from the dividing mirror DM to the entry end surface of the optical fiber OF are equal to each other in length. This makes it possible to, in a case where the laser diode LD outputs a single-mode laser beam, prevent two partial beams from interfering with each other distractively. In a case where the laser diode LD outputs a multimode laser beam, two partial beams will not interfere with each other distractively. Thus, there is no need for the respective optical paths of two partial beams which optical paths extend from the dividing mirror DM to the entry end surface of the optical fiber OF to be equal to each other in length.

[Second Embodiment]

Figure 3:
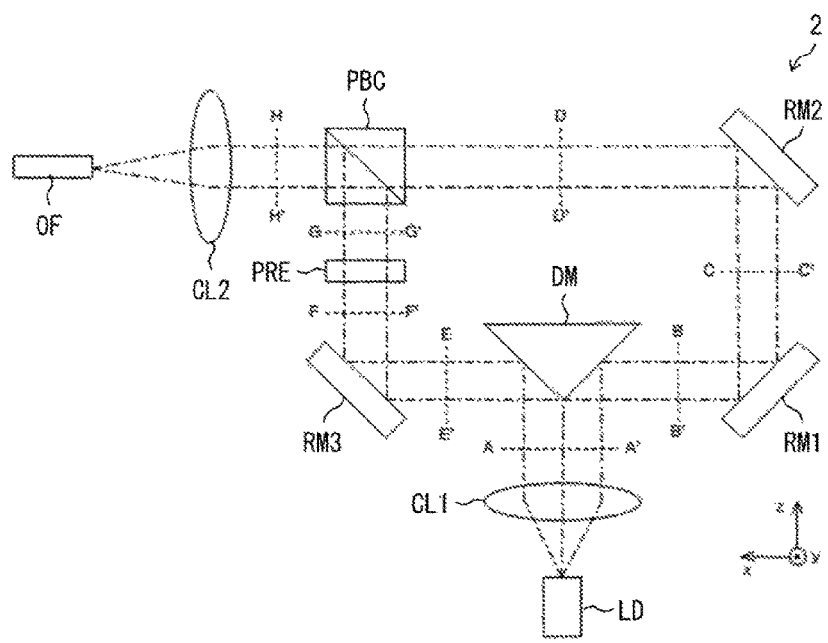
FIG. 3 is a plan view of an LD module in accordance with a second embodiment of the present invention, the view illustrating the configuration of the LD module.
Figure 4:
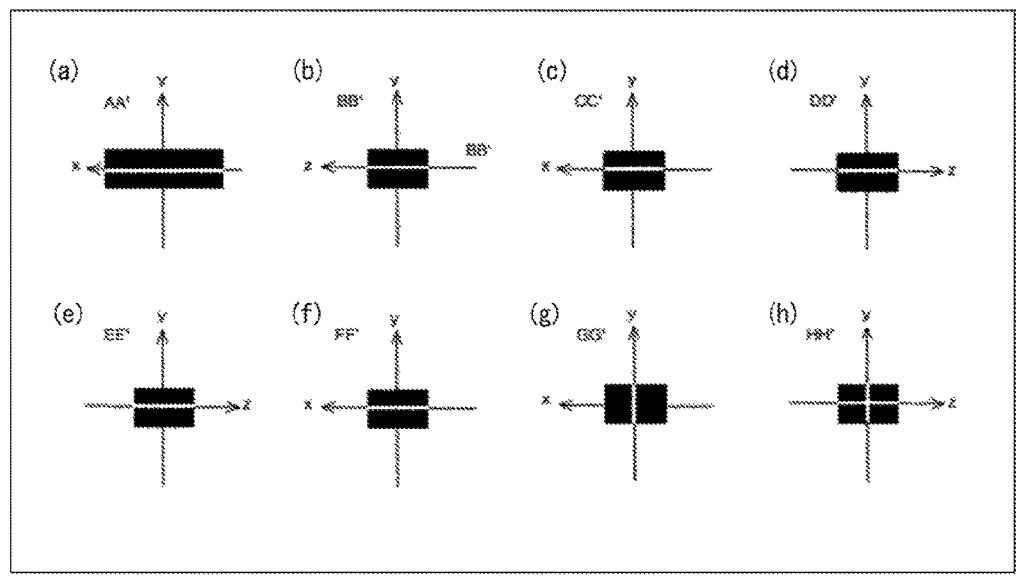
FIG. 4 shows cross-sectional views of a laser beam, a partial beam, and a partial beam bundle at different portions of the LD module illustrated in FIG. 3, the views each illustrating a beam cross section.

The description below deals with an LD module 2 in accordance with a second embodiment of the present invention with reference to FIGS. 3 and 4. FIG. 3 is a plan view of the LD module 2, the view illustrating the configuration of the LD module 2. FIG. 4 shows cross-sectional views of a laser beam, a partial beam, and a partial beam bundle at different portions of the LD module 2, the views each illustrating a beam cross section.

The LD module 2, as illustrated in FIG. 3, includes a laser diode LD, a collimating lens CL1, a dividing mirror DM, a first reflective mirror RM1, a second reflective mirror RM2, a third reflective mirror RM3, a polarization rotating element PRE, a polarization beam combiner PBC, a convergent lens CL2, and an optical fiber OF. The LD module 2 is configured such that the collimating lens CL1, the dividing mirror DM, the first reflective mirror RM1, the second reflective mirror RM2, the third reflective mirror RM3, the polarization rotating element PRE, the polarization beam combiner PBC, and the convergent lens CL2 constitute a light-guiding device configured to guide laser light from the laser diode LD to the optical fiber OF.

The laser diode LD outputs a laser beam. The laser diode LD is oriented so as to have, in the coordinate system illustrated, (i) an active layer parallel to the zx plane and (ii) an emission end surface facing the z-axis positive direction. The laser diode LD thus outputs a laser beam having (i) an S axis parallel to the x axis, (ii) an F axis parallel to the y axis, and (iii) a polarization direction parallel to the x axis. The laser beam outputted from the laser diode LD travels in the z-axis positive direction.

The laser beam generated by the laser diode LD has an optical path on which the collimating lens CL1 is positioned. The collimating lens CL1 collimates the laser beam outputted from the laser diode LD. In other words, before passing through the collimating lens CL1, the laser beam is diffused light having an S-axis diameter and an F-axis diameter both of which become gradually larger, but after passing through the collimating lens CL1, the laser beam is parallel light having a constant S-axis diameter and a constant F-axis diameter.

(a) of FIG. 4 shows a beam cross section (AA' cross section) of a laser beam collimated through the collimating lens CL1. As illustrated in (a) of FIG. 4, the laser beam collimated through the collimating lens CL1 has an S axis parallel to the x axis and an F axis parallel to the y axis.

The laser beam collimated through the collimating lens CL1 has an optical path on which the dividing mirror DM is positioned. The dividing mirror DM divides the laser beam collimated through the collimating lens CL1 and thereby generates a partial beam group consisting of a first partial beam and a second partial beam having respective traveling directions different from each other. The dividing mirror DM for use in the present embodiment has (1) a first reflective surface that reflects half of the laser beam collimated through the collimating lens CL1 which half is present on the side of the x-axis negative direction so that the reflected half will be directed in the x-axis negative direction and (2) a second reflective surface that reflects half of the laser beam collimated through the collimating lens CL1 which half is present on the side of the x-axis positive direction so that the reflected half will be directed in the x-axis positive direction. The half of the laser beam collimated through the collimating lens CL1 which half is present on the side of the x-axis negative direction is thus reflected on the first reflective surface of the dividing mirror DM and travels in the x-axis negative direction as the first partial beam. The first partial beam has (i) an S-axis diameter half the S-axis diameter of the laser beam collimated through the collimating lens CL1 and (ii) an F-axis diameter equal to the F-axis diameter of the laser beam collimated through the collimating lens CL1. The half of the laser beam collimated through the collimating lens CL1 which half is present on the side of the x-axis positive direction is reflected on the second reflective surface of the dividing mirror DM and travels in the x-axis positive direction as the second partial beam. The second partial beam has (i) an S-axis diameter half the S-axis diameter of the laser beam collimated through the collimating lens CL1 and (ii) an F-axis diameter equal to the F-axis diameter of the laser beam collimated through the collimating lens CL1.

(b) of FIG. 4 shows a beam cross section (BB' cross section) of the first partial beam generated through the dividing mirror DM. (e) of FIG. 4 shows a beam cross section (EE' cross section) of the second partial beam generated through the dividing mirror DM. As illustrated in (b) of FIG. 4, the beam cross section of the first partial beam generated through the dividing mirror DM has an S axis parallel to the z axis and an F axis parallel to the y axis. As illustrated in (e) of FIG. 4, the beam cross section of the second partial beam generated through the dividing mirror DM has an S axis parallel to the z axis and an F axis parallel to the y axis. The first partial beam and the second partial beam both generated through the dividing mirror DM each have an S-axis diameter half the S-axis diameter of the laser beam collimated through the collimating lens CL1. The first partial beam and the second partial beam both generated through the dividing mirror DM each have an F-axis diameter equal to the F-axis diameter of the laser beam collimated through the collimating lens CL1.

The first partial beam generated through the dividing mirror DM has an optical path on which the first reflective mirror RM1 is positioned. The first reflective mirror RM1 reflects the first partial beam generated through the dividing mirror DM so as to change the traveling direction of the first partial beam from the x-axis negative direction to the z-axis positive direction.

(c) of FIG. 4 shows a beam cross section (CC' cross section) of the first partial beam reflected by the first reflective mirror RM1. As illustrated in (c) of FIG. 4, the beam cross section of the first partial beam reflected by the first reflective mirror RM1 has an S axis parallel to the x axis, an F axis parallel to the y axis, and a polarization direction parallel to the x axis.

The first partial beam reflected by the first reflective mirror RM1 has an optical path on which the second reflective mirror RM2 is positioned. The second reflective mirror RM2 reflects the first partial beam reflected by the first reflective mirror RM1 so as to change the traveling direction of the first partial beam from the z-axis positive direction to the x-axis positive direction.

(d) of FIG. 4 shows a beam cross section (DD' cross section) of the first partial beam reflected by the second reflective mirror RM2. As illustrated in (d) of FIG. 4, the beam cross section of the first partial beam reflected by the second reflective mirror RM2 has an S axis parallel to the z axis, an F axis parallel to the y axis, and a polarization direction parallel to the z axis.

The second partial beam generated through the dividing mirror DM has an optical path on which the third reflective mirror RM3 is positioned. The third reflective mirror RM3 reflects the second partial beam generated through the dividing mirror DM so as to change the traveling direction of the second partial beam from the x-axis positive direction to the z-axis positive direction.

(f) of FIG. 4 shows a beam cross section (FF' cross section) of the second partial beam reflected by the third reflective mirror RM3. As illustrated in (f) of FIG. 4, the beam cross section of the second partial beam reflected by the third reflective mirror RM3 has an S axis parallel to the x axis, an F axis parallel to the y axis, and a polarization direction parallel to the x axis.

The second partial beam reflected by the third reflective mirror RM3 has an optical path on which the polarization rotating element PRE is positioned. The polarization rotating element PRE rotate by 90 degrees the polarization direction of the second partial beam reflected by the third reflective mirror RM3. Before passing through the polarization rotating element PRE, the second partial beam has a polarization direction parallel to the x axis, but after passing through the polarization rotating element PRE, the second partial beam has a polarization direction parallel to the y axis.

(g) of FIG. 4 shows a beam cross section (GG' cross section) of the second partial beam having a polarization direction rotated by the polarization rotating element PRE. As illustrated in (g) of FIG. 4, the beam cross section of the second partial beam having a polarization direction rotated by the polarization rotating element PRE has an S axis parallel to the x axis, an F axis parallel to the y axis, and a polarization direction parallel to the y axis. Note that the polarization direction of the second partial beam is rotated from a direction parallel to the x axis to a direction parallel to the y axis as the second partial beam passes through the polarization rotating element PRE.

The first partial beam reflected by the second reflective mirror RM2 has an optical path, whereas the second partial beam having passed through the polarization rotating element PRE has an optical path, the two optical paths crossing each other at a point at which the polarization beam combiner PBC is positioned. The polarization beam combiner PBC polarization-composites the first partial beam reflected by the second reflective mirror RM2 and the second partial beam having passed through the polarization rotating element PRE and thereby generates a partial beam bundle consisting of the first partial beam and the second partial beam, which share the same traveling direction and the same S-axis direction. The polarization beam combiner PBC for use in the present embodiment has a functional surface that allows passage therethrough of a first partial beam reflected by the second reflective mirror RM2 and having a polarization direction parallel to the zx plane (which first partial beam has an S axis direction parallel to the z axis and travels in the x-axis positive direction) and that reflects a second partial beam having passed through the polarization rotating element PRE and having a polarization direction perpendicular to the zx plane (which second partial beam has an S axis parallel to the y axis and travels in the z-axis positive direction) so that the reflected second partial beam will travel in the x-axis positive direction. The polarization beam combiner PBC thus generates a partial beam bundle consisting of a first partial beam and a second partial beam each having an S axis parallel to the z axis and traveling in the x-axis positive direction.

The first reflective mirror RM1, the second reflective mirror RM2, and the third reflective mirror for use in the present embodiment are oriented so that the first partial beam reflected by the first reflective mirror and the second reflective mirror and the second partial beam reflected by the third reflective mirror are incident on the same region of the functional surface of the polarization beam combiner PBC. Thus, in the partial beam bundle generated by the polarization beam combiner PBC, the respective beam cross sections of the first partial beam and the second partial beam coincide entirely with each other. The partial beam bundle thus has an S-axis diameter that is equal to the respective S-axis diameters of the first partial beam and the second partial beam and that is approximately half the S-axis diameter of the laser beam. The partial beam bundle has an F-axis diameter that is equal to the respective F-axis diameters of the first partial beam and the second partial beam and that is also equal to the F-axis diameter of the laser beam.

(h) of FIG. 4 shows a beam cross section (HH' cross section) of a partial beam bundle generated by the polarization beam combiner PBC. As illustrated in (h) of FIG. 4, the respective beam cross sections of the individual partial beams constituting the partial beam bundle generated by the polarization beam combiner PBC each have an S axis parallel to the z axis and an F axis parallel to the y axis. As described above, the partial beam bundle generated by the polarization beam combiner PBC has an S-axis diameter approximately half the S-axis diameter of the laser beam collimated through the collimating lens CL1. The partial beam bundle generated by the polarization beam combiner PBC has an F-axis diameter equal to the F-axis diameter of the laser beam collimated through the collimating lens CL1.

The partial beam bundle generated by the polarization beam combiner PBC has an optical path on which the convergent lens CL2 is positioned. The convergent lens CL2 converges a partial beam bundle generated by the polarization beam combiner PBC. In other words, before passing through the convergent lens CL2, the partial beam bundle is parallel light having a constant S-axis diameter and a constant F-axis diameter, but after passing through the convergent lens CL2, the partial beam bundle is convergent light having an S-axis diameter and an F-axis diameter both of which become gradually smaller.

The partial beam bundle converged by the convergent lens CL2 has an optical path on which the entry end surface of the optical fiber OF is positioned. The entry end surface of the optical fiber OF is oriented so that the center of the core of the optical fiber coincides with the center of the beam cross section of the partial beam bundle at a point at which the S-axis diameter of the partial beam bundle is at its minimum. This allows the beam cross section of the partial beam bundle to be within the core of the optical fiber OF at the entry end surface of the optical fiber OF.

As described above, the LD module 2 includes a light-guiding device including (1) a dividing optical system (including a dividing mirror DM) configured to divide a laser beam collimated through the collimating lens CL1 and thereby generate a partial beam group consisting of a first partial beam traveling in the x-axis negative direction and a second partial beam traveling in the x-axis positive direction and (2) a compositing optical system (including a first reflective mirror RM1, a second reflective mirror RM2, a third reflective mirror RM3, a polarization rotating element PRE, and a polarization beam combiner PBC) configured to composite the partial beam group and thereby generate a partial beam bundle consisting of a first partial beam and a second partial beam both traveling in the x-axis positive direction.

The dividing optical system halves the beam cross section of the laser beam along a dividing line parallel to the F axis of the laser beam. As a result, the first partial beam and the second partial beam each have (i) an S-axis diameter half the S-axis diameter of the laser beam and (ii) an F-axis diameter equal to the F-axis diameter of the laser beam. The compositing optical system polarization-composites the partial beam group so that in each cross section (HH' cross section) of the partial beam bundle, (1) the first partial beam and the second partial beam constituting the partial beam bundle each have an S axis parallel to a first spatial axis (z axis), and (2) the respective beam cross sections of the first partial beam and the second partial beam constituting the partial beam bundle coincide entirely with each other. As a result, the partial beam bundle has (i) an S-axis diameter half the S-axis diameter of the laser beam and (ii) an F-axis diameter equal to the F-axis diameter of the laser beam.

Using a light-guiding device configured as above allows a laser beam outputted from the laser diode LD to be converted into a partial beam bundle having an S-axis diameter smaller than the S-axis diameter of the laser beam. This makes it possible to increase the emitter width of the laser diode LD without decreasing the efficiency of coupling between the laser diode LD and the optical fiber OF. This in turn makes it possible to increase the reliability of the LD module 2 without decreasing its coupling efficiency.

The light-guiding device included in the LD module 2 in accordance with the present embodiment, in particular, allows a laser beam outputted from the laser diode LD to be converted into a partial beam bundle having an S-axis diameter that is half the S-axis diameter of the laser beam. This makes it possible to increase the emitter width of the laser diode LD two-fold without decreasing the efficiency of coupling between the laser diode LD and the optical fiber OF. This in turn makes it possible to dramatically increase the reliability of the LD module 2 without decreasing its coupling efficiency.

[Third Embodiment]

The description below deals with an LD module 3 in accordance with a third embodiment of the present invention with reference to FIGS. 5 and 6. (a) of FIG. 5 is a plan view of the LD module 3, the view illustrating the configuration of the LD module 3. (b) of FIG. 5 is a perspective view of a double reflective mirror DRM included in the LD module 3, the view illustrating the configuration of the double reflective mirror DRM. FIG. 6 shows cross-sectional views of a laser beam, a partial beam, and a partial beam bundle at different portions of the LD module 3, the views each illustrating a beam cross section.

The LD module 3, as illustrated in (a) of FIG. 5, includes a laser diode LD, a collimating lens CL1, a dividing mirror DM, a first reflective mirror RM1, a second reflective mirror RM2, a third reflective mirror RM3, a fourth reflective mirror RM4, a double reflective mirror DRM, a convergent lens CL2, and an optical fiber OF. The LD module 3 is configured such that the collimating lens CL1, the dividing mirror DM, the first reflective mirror RM1, the second reflective mirror RM2, the third reflective mirror RM3, the fourth reflective mirror RM4, the double reflective mirror DRM, and the convergent lens CL2 constitute a light-guiding device configured to guide laser light from the laser diode LD to the optical fiber OF.

The laser diode LD outputs a laser beam. The laser diode LD is oriented so as to have, in the coordinate system illustrated, (i) an active layer parallel to the zx plane and (ii) an emission end surface facing the z-axis positive direction. The laser diode LD thus outputs a laser beam having (i) an S axis parallel to the x axis, (ii) an F axis parallel to the y axis, and (iii) a polarization direction parallel to the x axis. The laser beam outputted from the laser diode LD travels in the z-axis positive direction.

The laser beam generated by the laser diode LD has an optical path on which the collimating lens CL1 is positioned. The collimating lens CL1 collimates the laser beam outputted from the laser diode LD. In other words, before passing through the collimating lens CL1, the laser beam is diffused light having an S-axis diameter and an F-axis diameter both of which become gradually larger, but after passing through the collimating lens CL1, the laser beam is parallel light having a constant S-axis diameter and a constant F-axis diameter.

(a) of FIG. 6 shows a beam cross section (AA' cross section) of a laser beam collimated through the collimating lens CL1. As illustrated in (a) of FIG. 6, the laser beam collimated through the collimating lens CL1 has an S axis parallel to the x axis and an F axis parallel to the y axis.

The laser beam collimated through the collimating lens CL1 has an optical path on which the dividing mirror DM is positioned. The dividing mirror DM divides the laser beam collimated through the collimating lens CL1 and thereby generates a partial beam group consisting of a first partial beam and a second partial beam having respective traveling directions different from each other. The dividing mirror DM for use in the present embodiment has (1) a first reflective surface that reflects half of the laser beam collimated through the collimating lens CL1 which half is present on the side of the x-axis negative direction so that the reflected half will be directed in the x-axis negative direction and (2) a second reflective surface that reflects half of the laser beam collimated through the collimating lens CL1 which half is present on the side of the x-axis positive direction so that the reflected half will be directed in the x-axis positive direction. The half of the laser beam collimated through the collimating lens CL1 which half is present on the side of the x-axis negative direction is thus reflected on the first reflective surface of the dividing mirror DM and travels in the x-axis negative direction as the first partial beam. The first partial beam has (i) an S-axis diameter half the S-axis diameter of the laser beam collimated through the collimating lens CL1 and (ii) an F-axis diameter equal to the F-axis diameter of the laser beam collimated through the collimating lens CL1. The half of the laser beam collimated through the collimating lens CL1 which half is present on the side of the x-axis positive direction is reflected on the second reflective surface of the dividing mirror DM and travels in the x-axis positive direction as the second partial beam. The second partial beam has (i) an S-axis diameter half the S-axis diameter of the laser beam collimated through the collimating lens CL1 and (ii) an F-axis diameter equal to the F-axis diameter of the laser beam collimated through the collimating lens CL1.

(b) of FIG. 6 shows a beam cross section (BB' cross section) of the first partial beam generated through the dividing mirror DM. (e) of FIG. 6 shows a beam cross section (EE' cross section) of the second partial beam generated through the dividing mirror DM. As illustrated in (b) of FIG. 6, the beam cross section of the first partial beam generated through the dividing mirror DM has an S axis parallel to the z axis and an F axis parallel to the y axis. As illustrated in (e) of FIG. 6, the beam cross section of the second partial beam generated through the dividing mirror DM has an S axis parallel to the z axis and an F axis parallel to the y axis. The first partial beam and the second partial beam both generated through the dividing mirror DM each have an S-axis diameter half the S-axis diameter of the laser beam collimated through the collimating lens CL1. The first partial beam and the second partial beam both generated through the dividing mirror DM each have an F-axis diameter equal to the F-axis diameter of the laser beam collimated through the collimating lens CL1.

The first partial beam generated through the dividing mirror DM has an optical path on which the first reflective mirror RM1 is positioned. The first reflective mirror RM1 reflects the first partial beam generated through the dividing mirror DM so as to change the traveling direction of the first partial beam as viewed in the y-axis positive direction from the x-axis negative direction to the z-axis positive direction. The first reflective mirror RM1 is inclined so as to reflect a first partial beam so that the reflected first partial beam will have a non-zero angle of elevation. With this configuration, the first partial beam reflected by the first reflective mirror RM1 has a beam cross section whose position is gradually shifted in the y-axis positive direction as the first partial beam travels.

(c) of FIG. 6 shows a beam cross section (CC' cross section) of the first partial beam reflected by the first reflective mirror RM1. As illustrated in (c) of FIG. 6, the beam cross section of the first partial beam reflected by the first reflective mirror RM1 has an S axis parallel to the x axis, an F axis whose projection on the xy plane is parallel to the y axis, and a polarization direction parallel to the x axis.

The first partial beam reflected by the first reflective mirror RM1 has an optical path on which the second reflective mirror RM2 is positioned. The second reflective mirror RM2 reflects the first partial beam reflected by the first reflective mirror RM1 so as to change the traveling direction of the first partial beam as viewed in the y-axis positive direction from the z-axis positive direction to the x-axis positive direction.

(d) of FIG. 6 shows a beam cross section (DD' cross section) of the first partial beam reflected by the second reflective mirror RM2. As illustrated in (d) of FIG. 6, the beam cross section of the first partial beam reflected by the second reflective mirror RM2 has an S axis parallel to the z axis, an F axis whose projection on the yz plane is parallel to the y axis, and a polarization direction parallel to the z axis.

The second partial beam generated through the dividing mirror DM has an optical path on which the third reflective mirror RM3 is positioned. The third reflective mirror RM3 reflects the second partial beam generated through the dividing mirror DM so as to change the traveling direction of the second partial beam as viewed in the y-axis positive direction from the x-axis positive direction to the z-axis positive direction. The third reflective mirror RM3 is inclined so as to reflect a second partial beam at an angle of depression. With this configuration, the second partial beam reflected by the third reflective mirror RM3 has a beam cross section whose position is gradually shifted in the y-axis negative direction as the second partial beam travels.

(f) of FIG. 6 shows a beam cross section (FF' cross section) of the second partial beam reflected by the third reflective mirror RM3. As illustrated in (f) of FIG. 6, the beam cross section of the second partial beam reflected by the third reflective mirror RM3 has an S axis parallel to the x axis, an F axis whose projection on the xy plane is parallel to the y axis, and a polarization direction parallel to the x axis.

The second partial beam reflected by the third reflective mirror RM3 has an optical path on which the fourth reflective mirror RM4 is positioned. The fourth reflective mirror RM4 reflects the second partial beam reflected by the third reflective mirror RM3 so as to change the traveling direction of the first partial beam as viewed in the y-axis positive direction from the z-axis positive direction to the x-axis negative direction.

(g) of FIG. 6 shows a beam cross section (GG' cross section) of the second partial beam reflected by the fourth reflective mirror RM4. As illustrated in (g) of FIG. 6, the beam cross section of the second partial beam reflected by the fourth reflective mirror RM4 has an S axis parallel to the z axis, an F axis whose projection on the yz plane is parallel to the y axis, and a polarization direction parallel to the z axis.

The second reflective mirror RM2 and the fourth reflective mirror RM4 are separated from each other by a distance at the midpoint of which the double reflective mirror DRM is positioned. The double reflective mirror DRM spatially composites the first partial beam reflected by the second reflective mirror RM2 and the second partial beam reflected by the fourth reflective mirror RM4 and thereby generates a partial beam bundle consisting of the first partial beam and the second partial beam, which share the same traveling direction as viewed in the y-axis positive direction and the same S-axis direction. The double reflective mirror DRM for use in the present embodiment has (1) a first reflective surface that reflects the first partial beam reflected by the second reflective mirror RM2 (which first partial beam travels in the x-axis positive direction as viewed in the y-axis positive direction) so that the reflected first partial beam will be directed in the z-axis positive direction as viewed in the y-axis positive direction and (2) a second reflective surface that reflected the second partial beam reflected by the fourth reflective mirror RM4 (which second partial beam travels in the x-axis negative direction as viewed in the y-axis positive direction) so that the reflected second partial beam will be directed in the z-axis positive direction as viewed in the y-axis positive direction. The double reflective mirror DRM thus generates a partial beam bundle consisting of a first partial beam and a second partial beam each having an S axis parallel to the x axis and traveling in the z-axis positive direction as viewed in the y-axis positive direction.

For the present embodiment, the first reflective surface and the second reflective surface of the double reflective mirror DRM are arranged along the y axis. The first reflective mirror RM1, the second reflective mirror RM2, the third reflective mirror RM3, and the fourth reflective mirror RM4 are oriented so that the first partial beam is incident on the first reflective surface of the double reflective mirror DRM and that the second partial beam is incident on the second reflective surface of the double reflective mirror DRM. The partial beam bundle generated by the polarization beam combiner PBC thus consists of a first partial beam and a second partial beam having respective beam cross sections with respective S axes that are parallel to the x axis and that are arranged along the y axis in such a manner that the respective projections of the S axes on the x axis coincide at least partially with each other. The partial beam bundle generated by the polarization beam combiner PBC thus has an S-axis diameter smaller than the sum of the respective S-axis diameters of the first partial beam and the second partial beam. The present embodiment, in particular, is configured such that the first partial beam and the second partial beam each have an S-axis diameter approximately half the S-axis diameter of the laser beam and that the first partial beam and the second partial beam have respective beam cross sections whose respective projections on the x axis coincide entirely with each other, which means that the S-axis diameter of the partial beam bundle is also approximately half the S-axis diameter of the laser beam. As illustrated in (b) of FIG. 5, the double reflective mirror DRM includes, for example, (i) a mirror in the shape of a triangular prism which mirror has the first reflective surface and (ii) a mirror in the shape of a triangular prism which mirror has the second reflective surface and which mirror is placed on the above mirror.

(h) of FIG. 6 shows a beam cross section (HH' cross section) of a partial beam bundle generated by the double reflective mirror DRM. As illustrated in (h) of FIG. 6, the respective beam cross sections of the individual partial beams constituting the partial beam bundle generated by the double reflective mirror DRM each have an S axis parallel to the x axis and an F axis whose projection on the xy plane is parallel to the y axis. As described above, the partial beam bundle generated by the double reflective mirror DRM has an S-axis diameter approximately half the S-axis diameter of the laser beam collimated through the collimating lens CL1.

The partial beam bundle generated by the double reflective mirror DRM has an optical path on which the convergent lens CL2 is positioned. The convergent lens CL2 converges a partial beam bundle generated by the double reflective mirror DRM. In other words, before passing through the convergent lens CL2, the partial beam bundle consists of individual partial beams each of which is parallel light having a constant S-axis diameter and a constant F-axis diameter, but after passing through the convergent lens CL2, the partial beam bundle consists of individual partial beams each of which is convergent light having an S-axis diameter and an F-axis diameter both of which become gradually smaller. Further, before passing through the convergent lens CL2, the partial beam bundle consists of individual partial beams that are separated from each other by a constant distance, but after passing through the convergent lens CL2, the partial beam bundle consists of individual partial beams that are separated from each other by a gradually decreasing distance.

The partial beam bundle converged by the convergent lens CL2 has an optical path on which the entry end surface of the optical fiber OF is positioned. The entry end surface of the optical fiber OF is oriented so that the center of the core of the optical fiber coincides with the midpoint between the respective centers of the respective beam cross sections of two partial beams constituting the partial beam bundle at a point at which the respective S-axis diameters of the individual partial beams constituting the partial beam bundle are each at its minimum (or at which the individual partial beams constituting the partial beam bundle are separated from each other by a minimum distance). This allows the respective beam cross sections of individual partial beams constituting the partial beam bundle to be within the core of the optical fiber OF at the entry end surface of the optical fiber OF.

As described above, the LD module 3 includes a light-guiding device including (1) a dividing optical system (including a dividing mirror DM) configured to divide a laser beam collimated through the collimating lens CL1 and thereby generate a partial beam group consisting of a first partial beam traveling in the x-axis negative direction and a second partial beam traveling in the x-axis positive direction and (2) a compositing optical system (including a first reflective mirror RM1, a second reflective mirror RM2, a third reflective mirror RM3, a fourth reflective mirror RM4, and a double reflective mirror DRM) configured to composite the partial beam group and thereby generate a partial beam bundle consisting of a first partial beam and a second partial beam both traveling in the z-axis positive direction as viewed in the y-axis positive direction.

The dividing optical system halves the beam cross section of the laser beam along a dividing line parallel to the F axis of the laser beam. As a result, the first partial beam and the second partial beam each have (i) an S-axis diameter half the S-axis diameter of the laser beam and (ii) an F-axis diameter equal to the F-axis diameter of the laser beam. The compositing optical system spatially composites the partial beam group so that in each cross section (HH' cross section) of the partial beam bundle, (1) the first partial beam and the second partial beam constituting the partial beam bundle each have an S axis parallel to a first spatial axis (x axis), and (2) the respective projections on the first spatial axis of the respective beam cross sections of the first partial beam and the second partial beam constituting the partial beam bundle coincide entirely with each other. The partial beam bundle thus has an S-axis diameter that is equal to the respective S-axis diameters of the first partial beam and the second partial beam and that is half the S-axis diameter of the laser beam.

Using a light-guiding device configured as above allows a laser beam outputted from the laser diode LD to be converted into a partial beam bundle having an S-axis diameter smaller than the S-axis diameter of the laser beam. This makes it possible to increase the emitter width of the laser diode LD without decreasing the efficiency of coupling between the laser diode LD and the optical fiber OF. This in turn makes it possible to increase the reliability of the LD module 3 without decreasing its coupling efficiency.

The light-guiding device included in the LD module 3 in accordance with the present embodiment, in particular, allows a laser beam outputted from the laser diode LD to be converted into a partial beam bundle having an S-axis diameter that is half the S-axis diameter of the laser beam. This makes it possible to increase the emitter width of the laser diode LD two-fold without decreasing the efficiency of coupling between the laser diode LD and the optical fiber OF. This in turn makes it possible to dramatically increase the reliability of the LD module 3 without decreasing its coupling efficiency.

The present embodiment is configured to halve a beam cross section of a laser beam along a dividing line parallel to the F axis of the laser beam so that a first partial beam and a second partial beam have an equal S-axis diameter. The present invention is, however, not limited to such a configuration. The present invention may be configured to divide a beam cross section of a laser beam along a dividing line parallel to the F axis into unequal parts so that a first partial beam and a second partial beam have respective S-axis diameters different from each other. In this case, the partial beam bundle will have an S-axis diameter equal to the larger of the respective S-axis diameters of the first partial beam and the second partial beam. The S-axis diameter of the partial beam bundle will thus be larger than half the S-axis diameter of the laser beam and smaller than the S-axis diameter of the laser beam.

The present embodiment is configured to composite a partial beam group in such a manner as to satisfy the following condition: The respective projections on a first spatial axis (x axis) of the respective beam cross sections of the first partial beam and the second partial beam constituting the partial beam bundle coincide entirely with each other. The present invention is, however, not limited to such a configuration. This condition may be replaced with the following condition: A portion of the projection on a first spatial axis of the beam cross section of the first partial beam included in the partial beam bundle and a portion of the projection on the first spatial axis of the beam cross section of the second partial beam included in the partial beam bundle coincide with each other. In this case, the S-axis diameter of the partial beam bundle will be larger than half the S-axis diameter of the laser beam and smaller than the S-axis diameter of the laser beam.

For the present embodiment, the number of partial beams constituting a partial beam group or a partial beam bundle is two. The present invention is, however, not limited to such a configuration. The number of partial beams constituting a partial beam group or a partial beam bundle can be generalized as any natural number n of two or more. In this case, the S-axis diameter of the partial beam bundle will be 1/n the S-axis diameter of the laser beam.

The present embodiment is configured such that the respective optical paths of two partial beams which optical paths extend from the dividing mirror DM to the entry end surface of the optical fiber OF are equal to each other in length. This makes it possible to, in a case where the laser diode LD outputs a single-mode laser beam, prevent two partial beams from interfering with each other distractively. In a case where the laser diode LD outputs a multimode laser beam, two partial beams will not interfere with each other distractively. Thus, there is no need for the respective optical paths of two partial beams which optical paths extend from the dividing mirror DM to the entry end surface of the optical fiber OF to be equal to each other in length.

[Fourth Embodiment]

The description below deals with an LD module 4 in accordance with a fourth embodiment of the present invention with reference to FIGS. 7 and 8. (a) of FIG. 7 is a plan view of the LD module 4, the view illustrating the configuration of the LD module 4. (b) of FIG. 7 is a perspective view of a second double reflective mirror DRM2 included in the LD module 4, the view illustrating the configuration of the second double reflective mirror DRM2. FIG. 8 shows cross-sectional views of a laser beam, a partial beam, and a partial beam bundle at different portions of the LD module 4, the views each illustrating a beam cross section.

The LD module 4, as illustrated in (a) of FIG. 7, includes a laser diode LD, a collimating lens CL1, a dividing mirror DM, a first reflective mirror RM1, a first double reflective mirror DRM1, a second reflective mirror RM2, a second double reflective mirror DRM2, a compositing mirror CM, a convergent lens CL2, and an optical fiber OF. The LD module 4 is configured such that the collimating lens CL1, the dividing mirror DM, the first reflective mirror RM1, the first double reflective mirror DRM1, the second reflective mirror RM2, the second double reflective mirror DRM2, the compositing mirror CM, and the convergent lens CL2 constitute a light-guiding device configured to guide laser light from the laser diode LD to the optical fiber OF.

The laser diode LD outputs a laser beam. The laser diode LD is oriented so as to have, in the coordinate system illustrated, (i) an active layer parallel to the zx plane and (ii) an emission end surface facing the z-axis positive direction. The laser diode LD thus outputs a laser beam having (i) an S axis parallel to the x axis, (ii) an F axis parallel to the y axis, and (iii) a polarization direction parallel to the x axis. The laser beam outputted from the laser diode LD travels in the z-axis positive direction.

The laser beam generated by the laser diode LD has an optical path on which the collimating lens CL1 is positioned. The collimating lens CL1 collimates the laser beam outputted from the laser diode LD. In other words, before passing through the collimating lens CL1, the laser beam is diffused light having an S-axis diameter and an F-axis diameter both of which become gradually larger, but after passing through the collimating lens CL1, the laser beam is parallel light having a constant S-axis diameter and a constant F-axis diameter.

(a) of FIG. 8 shows a beam cross section (AA' cross section) of a laser beam collimated through the collimating lens CL1. As illustrated in (a) of FIG. 8, the laser beam collimated through the collimating lens CL1 has an S axis parallel to the x axis and an F axis parallel to the y axis.

The laser beam collimated through the collimating lens CL1 has an optical path on which the dividing mirror DM is positioned. The dividing mirror DM divides the laser beam collimated through the collimating lens CL1 and thereby generates a partial beam group consisting of a first partial beam and a second partial beam having respective traveling directions different from each other. The dividing mirror DM for use in the present embodiment has (1) a first reflective surface that reflects half of the laser beam collimated through the collimating lens CL1 which half is present on the side of the x-axis negative direction so that the reflected half will be directed in the x-axis negative direction and (2) a second reflective surface that reflects half of the laser beam collimated through the collimating lens CL1 which half is present on the side of the x-axis positive direction so that the reflected half will be directed in the x-axis positive direction. The half of the laser beam collimated through the collimating lens CL1 which half is present on the side of the x-axis negative direction is thus reflected on the first reflective surface of the dividing mirror DM and travels in the x-axis negative direction as the first partial beam. The first partial beam has (i) an S-axis diameter half the S-axis diameter of the laser beam collimated through the collimating lens CL1 and (ii) an F-axis diameter equal to the F-axis diameter of the laser beam collimated through the collimating lens CL1. The half of the laser beam collimated through the collimating lens CL1 which half is present on the side of the x-axis positive direction is reflected on the second reflective surface of the dividing mirror DM and travels in the x-axis positive direction as the second partial beam. The second partial beam has (i) an S-axis diameter half the S-axis diameter of the laser beam collimated through the collimating lens CL1 and (ii) an F-axis diameter equal to the F-axis diameter of the laser beam collimated through the collimating lens CL1.

(b) of FIG. 8 shows a beam cross section (BB' cross section) of the first partial beam generated through the dividing mirror DM. (e) of FIG. 8 shows a beam cross section (EE' cross section) of the second partial beam generated through the dividing mirror DM. As illustrated in (b) of FIG. 8, the beam cross section of the first partial beam generated through the dividing mirror DM has an S axis parallel to the z axis and an F axis parallel to the y axis. As illustrated in (e) of FIG. 8, the beam cross section of the second partial beam generated through the dividing mirror DM has an S axis parallel to the z axis and an F axis parallel to the y axis. The first partial beam and the second partial beam both generated through the dividing mirror DM each have an S-axis diameter half the S-axis diameter of the laser beam collimated through the collimating lens CL1. The first partial beam and the second partial beam both generated through the dividing mirror DM each have an F-axis diameter equal to the F-axis diameter of the laser beam collimated through the collimating lens CL1.

The first partial beam generated through the dividing mirror DM has an optical path on which the first reflective mirror RM1 is positioned. The first reflective mirror RM1 reflects the first partial beam generated through the dividing mirror DM so as to change the traveling direction of the first partial beam from the x-axis negative direction to the z-axis positive direction.

(c) of FIG. 8 shows a beam cross section (CC' cross section) of the first partial beam reflected by the first reflective mirror RM1. As illustrated in (c) of FIG. 8, the beam cross section of the first partial beam reflected by the first reflective mirror RM1 has an S axis parallel to the x axis, an F axis parallel to the y axis, and a polarization direction parallel to the x axis.

The first partial beam reflected by the first reflective mirror RM1 has an optical path on which the first double reflective mirror DRM1 is positioned. The first double reflective mirror DRM1 has (1) a first reflective surface that reflects the first partial beam reflected by the first reflective mirror RM1 and traveling in the z-axis positive direction so that the first partial beam reflected on the first reflective surface will be directed in the y-axis positive direction and (2) a second reflective surface that reflects the first partial beam reflected on the first reflective surface and traveling in the y-axis positive direction so that the first partial beam reflected on the second reflective surface will be directed in the x-axis positive direction. The first double reflective mirror DRM1 reflects the first partial beam, which has been reflected by the first reflective mirror RM1, on the two reflective surfaces consecutively so as to (i) change the traveling direction of the first partial beam from the z-axis positive direction to the x-axis positive direction and (ii) rotate the S-axis direction and the F-axis direction of the first partial beam by 90 degrees.

(d) of FIG. 8 shows a beam cross section (DD' cross section) of the first partial beam reflected by the first double reflective mirror DRM1. As illustrated in (d) of FIG. 8, the beam cross section of the first partial beam reflected by the first double reflective mirror DRM1 has an S axis parallel to the y axis, an F axis parallel to the z axis, and a polarization direction parallel to the y axis.

The second partial beam generated through the dividing mirror DM has an optical path on which the second reflective mirror RM2 is positioned. The second reflective mirror RM2 reflects the second partial beam generated through the dividing mirror DM so as to change the traveling direction of the second partial beam from the x-axis positive direction to the z-axis positive direction.

(f) of FIG. 8 shows a beam cross section (FF' cross section) of the second partial beam reflected by the second reflective mirror RM2. As illustrated in (e) of FIG. 8, the beam cross section of the second partial beam reflected by the second reflective mirror RM2 has an S axis parallel to the x axis, an F axis parallel to the y axis, and a polarization direction parallel to the x axis.

The second partial beam reflected by the second reflective mirror RM2 has an optical path on which the second double reflective mirror DRM2 is positioned. The second double reflective mirror DRM2 has (1) a first reflective surface that reflects the second partial beam reflected by the second reflective mirror RM2 and traveling in the z-axis positive direction so that the second partial beam reflected on the first reflective surface will be directed in the y-axis positive direction and (2) a second reflective surface that reflects the second partial beam reflected on the first reflective surface and traveling in the y-axis positive direction so that the second partial beam reflected on the second reflective surface will be directed in the x-axis negative direction. The second double reflective mirror DRM2 reflects the first partial beam, which has been reflected by the second reflective mirror RM2, on the two reflective surfaces consecutively so as to (i) change the traveling direction of the second partial beam from the z-axis positive direction to the x-axis negative direction and (ii) rotate the S-axis direction and the F-axis direction of the second partial beam by 90 degrees. As illustrated in (b) of FIG. 7, the second double reflective mirror DRM2 can be, for example, a prism having (i) a total-reflection surface that functions as the first reflective surface and (ii) a total-reflection surface that functions as the second reflective surface. This applies also to the first double reflective mirror DRM1 described above.

(g) of FIG. 8 shows a beam cross section (GG' cross section) of the second partial beam reflected by the second double reflective mirror DRM2. As illustrated in (g) of FIG. 8, the beam cross section of the second partial beam reflected by the second double reflective mirror DRM2 has an S axis parallel to the y axis, an F axis parallel to the z axis, and a polarization direction parallel to the y axis.

The first double reflective mirror DRM1 and the second double reflective mirror DRM2 are separated from each other by a distance at the midpoint of which the compositing mirror CM is positioned. The compositing mirror CM spatially composites the first partial beam reflected by the first double reflective mirror DRM1 and the second partial beam reflected by the second double reflective mirror DRM2 and thereby generates a partial beam bundle consisting of the first partial beam and the second partial beam, which share the same traveling direction and the same S-axis direction. The compositing mirror CM for use in the present embodiment has (1) a first reflective surface that reflects the first partial beam reflected by the first double reflective mirror DRM1 (which first partial beam travels in the x-axis positive direction) so that the first partial beam reflected on the first reflective surface will be directed in the z-axis positive direction and (2) a second reflective surface that reflects the second partial beam reflected by the second double reflective mirror DRM2 (which second partial beam travels in the x-axis negative direction) so that the second partial beam reflected on the second reflective surface will be directed in the z-axis positive direction. The compositing mirror CM thus generates a partial beam bundle consisting of a first partial beam and a second partial beam each having an S axis parallel to the y axis and traveling in the z-axis positive direction.

For the present embodiment, the first reflective surface and the second reflective surface of the compositing mirror CM are arranged along the x axis. The first reflective mirror RM1, the second reflective mirror RM2, the first double reflective mirror DRM1, and the second double reflective mirror DRM2 are oriented so that the first partial beam is incident on the first reflective surface of the compositing mirror CM and that the second partial beam is incident on the second reflective surface of the compositing mirror CM. The partial beam bundle generated by the polarization beam combiner PBC thus consists of a first partial beam and a second partial beam having respective beam cross sections with respective S axes that are parallel to the y axis and that are arranged along the x axis in such a manner that the respective projections of the S axes on the y axis coincide at least partially with each other. The partial beam bundle generated by the polarization beam combiner PBC thus has an S-axis diameter smaller than the sum of the respective S-axis diameters of the first partial beam and the second partial beam. The present embodiment, in particular, is configured such that the first partial beam and the second partial beam each have an S-axis diameter approximately half the S-axis diameter of the laser beam and that the first partial beam and the second partial beam have respective beam cross sections whose respective projections on the y axis coincide entirely with each other, which means that the S-axis diameter of the partial beam bundle is also approximately half the S-axis diameter of the laser beam. The compositing mirror CM can be, for example, a mirror in the shape of a triangular prism having two side surfaces orthogonal to each other.

(h) of FIG. 8 shows a beam cross section (HH' cross section) of a partial beam bundle generated by the compositing mirror CM. As illustrated in (h) of FIG. 8, the respective beam cross sections of the individual partial beams constituting the partial beam bundle generated by the compositing mirror CM each have an S axis parallel to the y axis and an F axis parallel to the x axis. As described above, the partial beam bundle generated by the compositing mirror CM has an S-axis diameter approximately half the S-axis diameter of the laser beam collimated through the collimating lens CL1.

The partial beam bundle generated by the compositing mirror CM has an optical path on which the convergent lens CL2 is positioned. The convergent lens CL2 converges a partial beam bundle generated by the compositing mirror CM. In other words, before passing through the convergent lens CL2, the partial beam bundle consists of individual partial beams each of which is parallel light having a constant S-axis diameter and a constant F-axis diameter, but after passing through the convergent lens CL2, the partial beam bundle consists of individual partial beams each of which is convergent light having an S-axis diameter and an F-axis diameter both of which become gradually smaller. Further, before passing through the convergent lens CL2, the partial beam bundle consists of individual partial beams that are separated from each other by a constant distance, but after passing through the convergent lens CL2, the partial beam bundle consists of individual partial beams that are separated from each other by a gradually decreasing distance.

The partial beam bundle converged by the convergent lens CL2 has an optical path on which the entry end surface of the optical fiber OF is positioned. The entry end surface of the optical fiber OF is oriented so that the center of the core of the optical fiber OF coincides with the midpoint between the respective centers of the respective beam cross sections of two partial beams constituting the partial beam bundle at a point at which the respective S-axis diameters of the individual partial beams constituting the partial beam bundle are each at its minimum (or at which the individual partial beams constituting the partial beam bundle are separated from each other by a minimum distance). This allows the respective beam cross sections of individual partial beams constituting the partial beam bundle to be within the core of the optical fiber OF at the entry end surface of the optical fiber OF.

As described above, the LD module 4 includes a light-guiding device including (1) a dividing optical system (including a dividing mirror DM) configured to divide a laser beam collimated through the collimating lens CL1 and thereby generate a partial beam group consisting of a first partial beam traveling in the x-axis negative direction and a second partial beam traveling in the x-axis positive direction and (2) a compositing optical system (including a first reflective mirror RM1, a first double reflective mirror DRM1, a second reflective mirror RM2, a second double reflective mirror DRM2, and a compositing mirror CM) configured to composite the partial beam group and thereby generate a partial beam bundle consisting of a first partial beam and a second partial beam both traveling in the z-axis positive direction.

The dividing optical system halves the beam cross section of the laser beam along a dividing line parallel to the F axis of the laser beam. As a result, the first partial beam and the second partial beam each have (i) an S-axis diameter half the S-axis diameter of the laser beam and (ii) an F-axis diameter equal to the F-axis diameter of the laser beam. The compositing optical system spatially composites the partial beam group so that in each cross section (HH' cross section) of the partial beam bundle, (1) the first partial beam and the second partial beam constituting the partial beam bundle each have an S axis parallel to a first spatial axis (y axis), and (2) the respective projections on the first spatial axis of the respective beam cross sections of the first partial beam and the second partial beam constituting the partial beam bundle coincide entirely with each other. The partial beam bundle thus has an S-axis diameter that is equal to the respective S-axis diameters of the first partial beam and the second partial beam and that is half the S-axis diameter of the laser beam.

Using a light-guiding device configured as above allows a laser beam outputted from the laser diode LD to be converted into a partial beam bundle having an S-axis diameter smaller than the S-axis diameter of the laser beam. This makes it possible to increase the emitter width of the laser diode LD without decreasing the efficiency of coupling between the laser diode LD and the optical fiber OF. This in turn makes it possible to increase the reliability of the LD module 4 without decreasing its coupling efficiency.

The light-guiding device included in the LD module 4 in accordance with the present embodiment, in particular, allows a laser beam outputted from the laser diode LD to be converted into a partial beam bundle having an S-axis diameter that is half the S-axis diameter of the laser beam. This makes it possible to increase the emitter width of the laser diode LD two-fold without decreasing the efficiency of coupling between the laser diode LD and the optical fiber OF. This in turn makes it possible to dramatically increase the reliability of the LD module 4 without decreasing its coupling efficiency.

[Fifth Embodiment]

The description below deals with an LD module 5 in accordance with a fifth embodiment of the present invention with reference to FIGS. 9 and 10. FIG. 9 is a plan view of the LD module 5, the view illustrating the configuration of the LD module 5. FIG. 10 shows cross-sectional views of a laser beam, a partial beam, and a partial beam bundle at different portions of the LD module 5, the views each illustrating a beam cross section.

The LD module 5 is similar to the LD module 1 in accordance with the first embodiment, but differs therefrom in that the LD module 5 includes a plurality of laser diodes LD, a plurality of collimating lenses CL1, a plurality of dividing mirrors DM, and a plurality of first reflective mirrors RM1. Specifically, the LD module 5, as illustrated in FIG. 9, includes a plurality of laser diodes LDa to LDc, the same number of collimating lenses CL1a to CL1c, the same number of dividing mirrors DMa to DMc, the same number of first reflective mirrors RM1a to RM1c, a second reflective mirror RM2, a polarization rotating element PRE, a polarization beam combiner PBC, a convergent lens CL2, and an optical fiber OF. Although FIG. 9 shows three laser diodes LDa to LDc, the number of laser diodes may be any natural number of two or more.

The LD module 5 is configured such that the collimating lens CL1a, the dividing mirror DMa, the first reflective mirror RM1a, the second reflective mirror RM2, the polarization rotating element PRE, the polarization beam combiner PBC, and the convergent lens CL2 constitute a first light-guiding device configured to serve to guide laser light from the first laser diode LDa to the optical fiber OF similarly to the light-guiding device of the LD module 1 in accordance with the first embodiment.

The LD module 5 is configured such that the collimating lens CL1b, the dividing mirror DMb, the first reflective mirror RM1b, the second reflective mirror RM2, the polarization rotating element PRE, the polarization beam combiner PBC, and the convergent lens CL2 constitute a second light-guiding device configured to serve to guide laser light from the second laser diode LDb to the optical fiber OF similarly to the light-guiding device of the LD module 1 in accordance with the first embodiment.

The LD module 5 is configured such that the collimating lens CL1c, the dividing mirror DMc, the first reflective mirror RM1c, the second reflective mirror RM2, the polarization rotating element PRE, the polarization beam combiner PBC, and the convergent lens CL2 constitute a third light-guiding device configured to serve to guide laser light from the third laser diode LDc to the optical fiber OF similarly to the light-guiding device of the LD module 1 in accordance with the first embodiment.

The LD module 5 is configured such that the laser diodes LDa to LDc are positioned differently in the y-axis direction. This configuration allows the respective laser beams outputted from the laser diodes LDa to LDc to be guided to the optical fiber OF without interfering with each other.

[Sixth Embodiment]

The description below deals with an LD module 6 in accordance with a sixth embodiment of the present invention with reference to FIGS. 11 and 12. FIG. 11 is a plan view of the LD module 6, the view illustrating the configuration of the LD module 6. FIG. 12 shows cross-sectional views of a laser beam, a partial beam, and a partial beam bundle at different portions of the LD module 6, the views each illustrating a beam cross section.

The LD module 6 is similar to the LD module 5 in accordance with the fifth embodiment, but differs therefrom in that the LD module 6 includes (i) first double reflective mirrors DRM1a to DRM1c instead of the dividing mirrors DMa to DMc and (ii) second double reflective mirrors DRM2a to DRM2c instead of the first reflective mirrors RM1a to RM1c. Specifically, the LD module 6, as illustrated in FIG. 11, includes a plurality of laser diodes LDa to LDc, the same number of collimating lenses CL1a to CL1c, the same number of first double reflective mirrors DRM1a to DRM1c, the same number of second double reflective mirrors DRM2a to DRM2c, a second reflective mirror RM2, a polarization rotating element PRE, a polarization beam combiner PBC, a convergent lens CL2, and an optical fiber OF. Although FIG. 11 shows three laser diodes LDa to LDc, the number of laser diodes may be any natural number of two or more.

The LD module 6 is configured such that the collimating lens CL1a, the first double reflective mirror DRM1a, the second double reflective mirror DRM2a, the second reflective mirror RM2, the polarization rotating element PRE, the polarization beam combiner PBC, and the convergent lens CL2 constitute a first light-guiding device configured to serve to guide laser light from the first laser diode LDa to the optical fiber OF similarly to the first light-guiding device of the LD module 5 in accordance with the fifth embodiment.

The first double reflective mirror DRM1*a* and the second double reflective mirror DRM2*a* each have the function of rotating the beam cross section of a partial beam by 90 degrees, so that the partial beam has an S axis parallel to the y axis.

The LD module 6 is configured such that the collimating lens CL1*b*, the first double reflective mirror DRM1*b*, the second double reflective mirror DRM2*b*, the second reflective mirror RM2, the polarization rotating element PRE, the polarization beam combiner PBC, and the convergent lens CL2 constitute a second light-guiding device configured to serve to guide laser light from the second laser diode LDb to the optical fiber OF similarly to the second light-guiding device of the LD module 5 in accordance with the fifth embodiment. The first double reflective mirror DRM1*b* and the second double reflective mirror DRM2*b* each have the function of rotating the beam cross section of a partial beam by 90 degrees, so that the partial beam has an S axis parallel to the y axis.

The LD module 6 is configured such that the collimating lens CL1*c*, the first double reflective mirror DRM1*c*, the second double reflective mirror DRM2*c*, the second reflective mirror RM2, the polarization rotating element PRE, the polarization beam combiner PBC, and the convergent lens CL2 constitute a third light-guiding device configured to serve to guide laser light from the third laser diode LDc to the optical fiber OF similarly to the third light-guiding device of the LD module 5 in accordance with the fifth embodiment. The first double reflective mirror DRM1*c* and the second double reflective mirror DRM2*c* each have the function of rotating the beam cross section of a partial beam by 90 degrees, so that the partial beam has an S axis parallel to the y axis.

The LD module 6 is configured such that the first double reflective mirrors DRM1*a* to DRM1*c* are positioned differently in the z-axis direction and that the second double reflective mirrors DRM2*a* to DRM2*c* are positioned differently in the z-axis direction. This configuration allows the respective laser beams outputted from the laser diodes LDa to LDc to be guided to the optical fiber OF without interfering with each other.

[Recap]

In order to attain the above object, a light-guiding device in accordance with an embodiment above includes: a dividing optical system configured to divide a laser beam so as to generate a partial beam group consisting of a plurality of partial beams having respective traveling directions different from each other; and a compositing optical system configured to composite the partial beam group so as to generate a partial beam bundle consisting of a plurality of partial beams each having an S axis parallel to a particular spatial axis, the partial beam bundle having an S-axis diameter smaller than an S-axis diameter of the laser beam.

The above configuration allows a laser beam to be converted into a partial beam bundle having an S-axis diameter smaller than the S-axis diameter of the laser beam. Thus, in a case where the above light-guiding device is mounted in an LD module including a laser diode and an optical fiber so that a laser beam outputted from the laser diode is guided to the optical fiber by the light-guiding device, it is possible to increase the emitter width of the laser diode without decreasing the efficiency of coupling between the laser diode and the optical fiber. This in turn makes it possible to increase the reliability of the LD module without decreasing the efficiency of coupling between the laser diode and the optical fiber.

The light-guiding device in accordance with an embodiment above may preferably be configured such that the dividing optical system is configured to divide the laser beam along a dividing line parallel to an F axis of the laser beam; and the compositing optical system is configured to composite the partial beam group in such a manner that in any cross section of the partial beam bundle, at least a portion of a projection, on the particular spatial axis, of a beam cross section of each of the plurality of partial beams coincides with at least a portion of a projection, on the particular spatial axis, of a beam cross section of another one of the plurality of partial beams.

The above configuration makes it possible to reliably generate a partial beam bundle having an S-axis diameter smaller than the S-axis diameter of the laser beam.

The light-guiding device in accordance with an embodiment above may preferably be configured such that the compositing optical system is configured to polarization-composite or wavelength-composite the partial beam group in such a manner that in any cross section of the partial beam bundle, at least a portion of a beam cross section of each of the plurality of partial beams coincides with at least a portion of a beam cross section of another one of the plurality of partial beams.

The above configuration makes it possible to, even in a case where the laser beam has a beam cross section that is not sufficiently oblate, reliably generate a partial beam bundle having an S-axis diameter smaller than the S-axis diameter of the laser beam.

The light-guiding device in accordance with an embodiment above may preferably be configured such that the compositing optical system is configured to spatially composite the plurality of partial beams.

The above configuration makes it possible to, without use of a polarization rotating element necessary for polarization compositing or a wavelength conversion element necessary for wavelength compositing, reliably generate a partial beam bundle having an S-axis diameter smaller than the S-axis diameter of the laser beam.

The light-guiding device in accordance with an embodiment above may preferably be configured such that the compositing optical system is configured to composite the partial beam group in such a manner that the plurality of partial beams have an equal optical path length.

The above configuration makes it possible to, in a case where the laser beam is in a single mode, prevent a plurality of partial beams from interfering with each other distractively.

The light-guiding device in accordance with an embodiment above may preferably be configured such that the dividing optical system is configured to divide the laser beam into n partial beams; and the compositing optical system is configured to composite the n partial beams so as to generate a partial beam bundle having an S-axis diameter that is 1/n the S-axis diameter of the laser beam.

The above configuration allows a laser beam to be converted into a partial beam bundle having an S-axis diameter that is 1/n the S-axis diameter of the laser beam. Thus, in a case where the above light-guiding device is mounted in the LD module so that a laser beam outputted from the laser diode is guided to the optical fiber by the light-guiding device, it is possible to increase the emitter width of the laser diode up to approximately n times those of conventional LD modules (which do not include the above light-guiding device) without decreasing the efficiency of coupling between the laser diode and the optical fiber. This in turn makes it possible to dramatically increase the reliability of the LD module without decreasing the efficiency of coupling between the laser diode and the optical fiber.

In order to attain the above object, an LD module in accordance with an embodiment above includes: the light-guiding device; a laser diode; and an optical fiber, the light-guiding device being configured to guide a laser beam, outputted from the laser diode, to the optical fiber.

The above configuration makes it possible to increase the emitter width of the laser diode without decreasing the efficiency of coupling between the laser diode and the optical fiber. This in turn makes it possible to increase the reliability of the LD module without decreasing the efficiency of coupling between the laser diode and the optical fiber.

The LD module in accordance with an embodiment above may preferably be configured such that the laser diode has an emitter width larger than a core diameter of the optical fiber.

The above configuration makes it possible to produce an LD module that is more reliable than conventional LD modules including a laser diode having an emitter width smaller than the core diameter of the optical fiber.

In order to attain the above object, a light-guiding method in accordance with an embodiment above includes the steps of: dividing a laser beam so as to generate a partial beam group including a plurality of partial beams having respective traveling directions different from each other; and compositing the partial beam group so as to generate a partial beam bundle including a plurality of partial beams each having an S axis parallel to a particular spatial axis, the partial beam bundle having an S-axis diameter smaller than an S-axis diameter of the laser beam.

The above steps allow a laser beam to be converted into a partial beam bundle having an S-axis diameter smaller than the S-axis diameter of the laser beam. Thus, in a case where the above light-guiding method is used for an LD module including a laser diode and an optical fiber so that a laser beam outputted from the laser diode is guided to the optical fiber by the light-guiding method, it is possible to increase the emitter width of the laser diode without decreasing the efficiency of coupling between the laser diode and the optical fiber. This in turn makes it possible to increase the reliability of the LD module without decreasing the efficiency of coupling between the laser diode and the optical fiber.

[Supplemental Notes]

The present invention is not limited to the description of the embodiments above, but may be altered variously by a skilled person within the scope of the claims. That is, the present invention covers in its technical scope any embodiment based on a combination of technical means modified as appropriate within the scope of the claims.

REFERENCE SIGNS LIST 1 to 6 LD module
LD Laser diode
CL1 Collimating lens
DM Dividing mirror
RM1 First reflective mirror
RM2 Second reflective mirror
PRE Polarization rotating element
PBC Polarization beam combiner
CL2 Convergent lens
OF Optical fiber

The invention claimed is:

1. A light-guiding device, comprising:
a dividing optical system configured to divide a laser beam so as to generate a partial beam group consisting of a plurality of partial beams having respective traveling directions different from each other; and
a compositing optical system configured to spatially composite the partial beam group so as to generate a partial beam bundle consisting of a plurality of partial beams, each of the plurality of partial beams having an S axis and a polarization direction both parallel to a particular spatial axis,
the partial beam bundle having an S-axis diameter smaller than an S-axis diameter of the laser beam.

2. The light-guiding device according to claim 1, wherein:
the dividing optical system is configured to divide the laser beam along a dividing line parallel to an F axis of the laser beam; and
the compositing optical system is configured to spatially composite the partial beam group in such a manner that in any cross section of the partial beam bundle, at least a portion of a projection, on the particular spatial axis, of a beam cross section of each of the plurality of partial beams coincides with at least a portion of a projection, on the particular spatial axis, of a beam cross section of another one of the plurality of partial beams.

3. The light-guiding device according to claim 1, wherein the compositing optical system is configured to composite the partial beam group in such a manner that the plurality of partial beams have an equal optical path length.

4. The light-guiding device according to claim 1, wherein:
the dividing optical system is configured to divide the laser beam into n partial beams, where n is a natural number of two or more; and
the compositing optical system is configured to spatially composite the n partial beams so as to generate a partial beam bundle having an S-axis diameter that is 1/n the S-axis diameter of the laser beam.

5. An LD module, comprising:
a light-guiding device according to claim 1;
a laser diode; and
an optical fiber,
the light-guiding device being configured to guide a laser beam, outputted from the laser diode, to the optical fiber.

6. The LD module according to claim 5, wherein the laser diode has an emitter width larger than a core diameter of the optical fiber.

7. A light-guiding method, comprising the steps of:
dividing a laser beam so as to generate a partial beam group including a plurality of partial beams having respective traveling directions different from each other; and
spatially compositing the partial beam group so as to generate a partial beam bundle including a plurality of partial beams, each of the plurality of partial beams having an S axis and a polarization direction both parallel to a particular spatial axis,
the partial beam bundle having an S-axis diameter smaller than an S-axis diameter of the laser beam.

8. A light-guiding device, comprising:
a dividing optical system configured to divide a laser beam so as to generate a partial beam group consisting of a plurality of partial beams having respective traveling directions different from each other; and
a compositing optical system configured to wavelength-composite the partial beam group so as to generate a partial beam bundle consisting of a plurality of partial beams, each of the plurality of partial beams having an S axis and a polarization direction both parallel to a particular spatial axis,
the partial beam bundle having an S-axis diameter smaller than an S-axis diameter of the laser beam.

* * * * *